(12) United States Patent
Kawabata et al.

(10) Patent No.: US 8,054,646 B2
(45) Date of Patent: Nov. 8, 2011

(54) CIRCUIT BOARD CONNECTING STRUCTURE

(75) Inventors: Masahito Kawabata, Kanagawa (JP); Yoshihito Fujiwara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 801 days.

(21) Appl. No.: 12/093,511

(22) PCT Filed: Feb. 20, 2006

(86) PCT No.: PCT/JP2006/302968
§ 371 (c)(1),
(2), (4) Date: May 13, 2008

(87) PCT Pub. No.: WO2007/055034
PCT Pub. Date: May 18, 2007

(65) Prior Publication Data
US 2009/0178837 A1    Jul. 16, 2009

(30) Foreign Application Priority Data
Nov. 14, 2005 (WO) .................. PCT/JP2005/020854

(51) Int. Cl.
 *H05K 1/11* (2006.01)
 *H05K 1/14* (2006.01)
(52) U.S. Cl. .................. 361/803; 361/749; 361/767
(58) Field of Classification Search .......... 174/254–261; 361/749–750, 777
See application file for complete search history.

(56) References Cited

U.S. PATENT DOCUMENTS

| 4,509,099 A | * | 4/1985 | Takamatsu et al. | 361/789 |
| 4,808,112 A | * | 2/1989 | Wood et al. | 439/66 |
| 6,444,923 B1 | | 9/2002 | Iriguchi et al. | |
| 6,472,820 B1 | | 10/2002 | Mo | |

FOREIGN PATENT DOCUMENTS

| JP | 53-42366 | 4/1978 |
| JP | 60-A-140896 | 7/1985 |
| JP | 60140896 | 7/1985 |
| JP | 02211690 | 8/1990 |
| JP | 6-31169 U | 4/1994 |
| JP | 06-188548 | 7/1994 |
| JP | 11-233912 | 8/1999 |

(Continued)

OTHER PUBLICATIONS

International Search Report with English translation.

(Continued)

*Primary Examiner* — Tuan T Dinh
(74) *Attorney, Agent, or Firm* — Seed IP Law Group PLLC

(57) ABSTRACT

The present invention provides a circuit board connecting structure enabled to obtain the reliable connection between circuit patterns by restricting the elongation of a flexible base material even when connecting portions are arranged in a face-to-face configuration and are press-contacted with each other. A circuit board connecting structure 10 includes a first circuit board 11, and a second circuit board 12. The circuit board connecting structure 10 is configured so that when a first connecting portion 13 and a second connecting portion 14 are sandwiched by a pair of pressing jigs 18, 19 and are press-contacted with each other, one 23 of first outer dummy terminals is accommodated between columns of ones 33, 33 of second outer dummy terminals, while the other first outer dummy terminal 24 is accommodated between columns of the other ones 34, 34 of the second outer dummy terminals.

5 Claims, 23 Drawing Sheets

FOREIGN PATENT DOCUMENTS

| | | |
|---|---|---|
| JP | 11-317173 | 11/1999 |
| JP | 2000-068624 | 3/2000 |
| JP | 2001-127424 | 5/2001 |
| JP | 2001267712 | 9/2001 |
| JP | 2002-032030 | 1/2002 |
| JP | 2002-032031 | 1/2002 |
| JP | 2002-050845 | 2/2002 |
| JP | 2002-298958 | 10/2002 |
| JP | 2002-328618 | 11/2002 |
| JP | 2002-341786 | 11/2002 |
| JP | 2003-264352 | 9/2003 |

OTHER PUBLICATIONS

Extended European Search Report mailed on Mar. 26, 2010, in corresponding European Patent Application No. 06714108.5.

International Search Report Dated Mar. 14, 2006.

Office Action mailed Jun. 7, 2011, for Japanese Patent Application No. 2007-544058, 6 pages.

\* cited by examiner

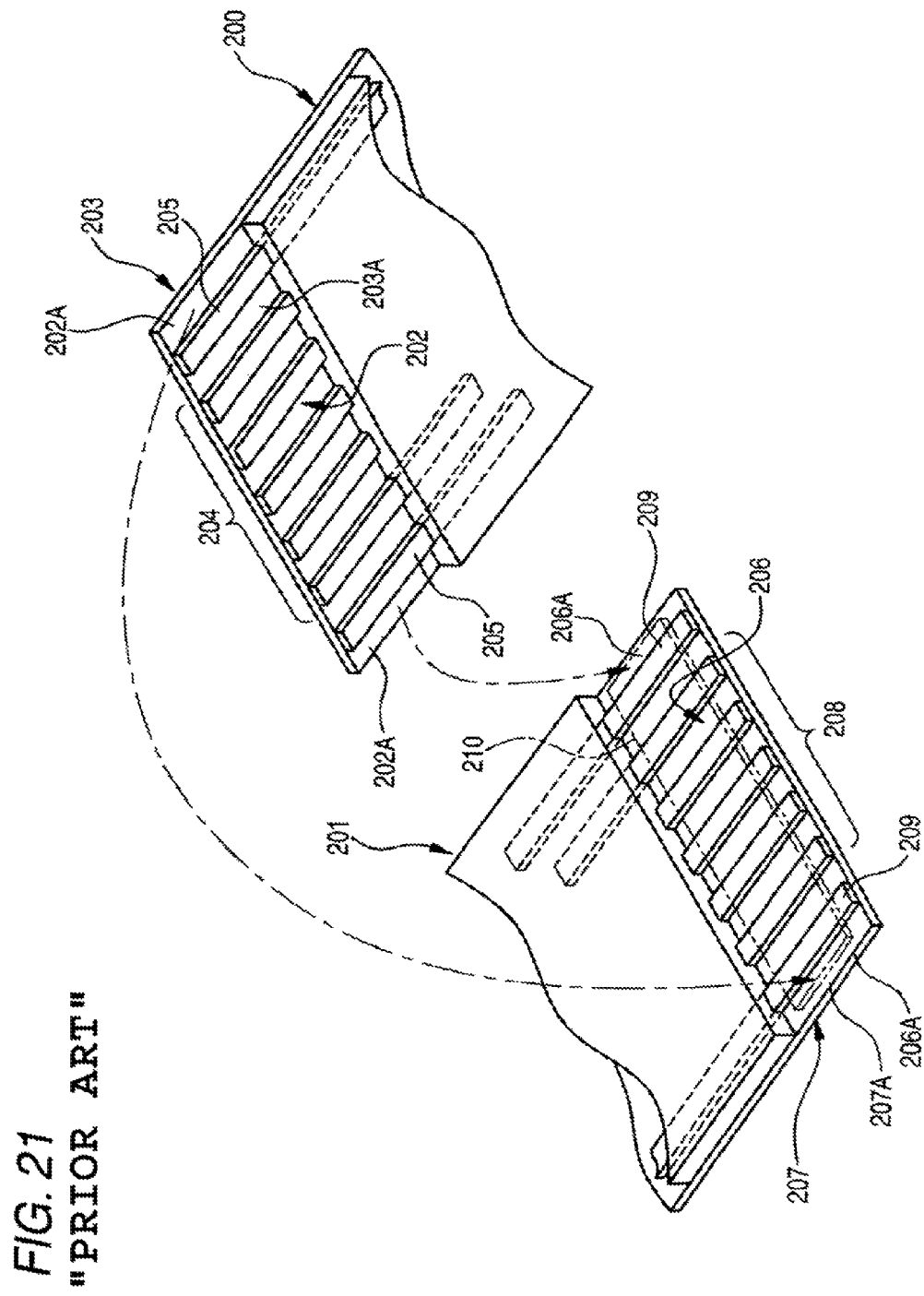
FIG. 21 "PRIOR ART"

CIRCUIT BOARD CONNECTING STRUCTURE

TECHNICAL FIELD

The present invention relates to a circuit board connecting structure that connects a circuit board made of a flexible base material to a circuit board made of a rigid base material.

BACKGROUND ART

For example, a connecting portion of a rigid circuit board and that of a flexible circuit board are connected to a portable terminal, such as a portable telephone, in a casing. The connecting portions of these circuit boards are illustrated in FIG. 21.

Incidentally, a description will be given by designating the flexible circuit board and the rigid circuit board as a first circuit board 200 and a second circuit board 201, respectively.

A connecting portion 202 of the first circuit board 200 is such that a plurality of (i.e., five) first circuit patterns 204 are disposed in parallel to one another along a surface 203A of the flexible base material 203, and that first dummy terminals 205 are provided at both end portions 202A in an arrangement direction of each of the first circuit patterns 204, respectively.

A connecting portion 206 of the second circuit board 201 is such that a plurality of (i.e., five) second circuit patterns 208 are disposed in parallel to one another along a surface 207A of the flexible base material 207, and that second dummy terminals 209 are provided at both end portions 206A in an arrangement direction of each of the second circuit patterns 208, respectively.

Further, as illustrated in FIG. 22(A), the first connecting portion 202 and the second connecting portion 206 arranged to face each other via an adhesive agent 210, and are sandwiched by a pressurizing jig 211 and 212. The first circuit board 200 and the second circuit board 201 are heated and pressure-contacted to each other so as to be connected to each other.

At that time, as illustrated in FIG. 22(B), the adhesive agent 210 having been pushed out from between the first circuit pattern 204 and the second circuit pattern 208, which face each other, with the application of heat and pressure thereto adheres to the flexible base material 203 and the rigid base material 207. Consequently, the first circuit pattern 204 and the second circuit pattern 208 having been brought into surface contact with each other are fixed to each other.

Meanwhile, the contact of the upper mold 212 constituting the pressurizing jig 211 and 212 with a rear surface 203B causes the flexible base material 203 to apply heat of the upper mold 212 to the adhesive agent 210 provided on a front surface 203A. Consequently, the adhesive agent 210 is softened or liquefied.

At that time, the flexible base material 203 is softened. As illustrated in FIG. 12, the flexible base material 203 is elongated in the direction of an arrow along a surface thereof with the application of pressure thereto.

Then, as illustrated in FIG. 23, each of the first circuit patterns 204 made of the flexible base material 203 is dislocated with respect to an associated one of the second circuit patterns 208 made of the rigid base material 207. Thus, the design value of the conduction area of each of the first and second circuit patterns cannot be assured. Additionally, conduction might not be obtained in a case where the patterns are tremendously the dislocated.

Especially, in recent years, multilayered flexible base materials 203 and multilayered rigid base materials 207 have been being frequently used. Accordingly, it has been difficult to quickly transmit heat from the rear surface to the front surface of each of the flexible base materials 203 and the rigid base materials 207.

Thus, there is a tendency to set the surface temperature and the pressing force of the upper mold 212 to be higher than those of conventional one. Consequently, the problem of the elongation of the flexible base material 203 has been actualized.

For such a problem, a structure has been proposed, which is configured to adjust the intervals and the positions of the second circuit patterns 208 made of the rigid base material 207 to those of the elongated base material 203 by preliminarily predicting the elongation of the flexible base material 203 (see Patent Documents 1, 2, and 3).

Patent Document 1: JP-A-2002-32030
Patent Document 2: JP-A-2002-32031
Patent Document 3: JP-A-2002-341786

DISCLOSURE OF THE INVENTION

Problems that the Invention is to Solve

However, according to Patent Documents 1, 2, and 3, it is necessary for predicting the elongation of the flexible base material 203 to comprehensively consider the thickness dimension, the pressing force, the heating temperature, and the pressure time of the flexible base material 203. In a case where one of these factors differs from a predicted value, the predicted value has no other choice to be changed. This is cumbersome.

Further, these Patent Documents 1, 2, and 3 describe the structures for allowing the elongation of the flexible base material 203 and for ensuring the reliable connection between the circuit patterns 204 and 208 as a follow-up. Thus, the structures are not fundamental solutions therefor.

The invention is accomplished to solve the aforementioned problem. An object of the invention is to provide a circuit board connecting structure enabled to obtain the reliable connection between circuit patterns by restricting the elongation of a flexible base material even when connecting portions are arranged in a face-to-face configuration and are press-contacted with each other.

Means for Solving the Problems

A circuit board connecting structure according to the invention is featured includes a first circuit board having a first connecting portion that includes a flexible base material, on the same surface of which a plurality of circuit patterns are arranged in parallel to one another, and first dummy terminals, which are parallel to the circuit patterns and are provided at both end portions in an arrangement direction in which the circuit patterns are arranged, and a second circuit board having a second connecting portion that includes a rigid base material, on the same surface of which a plurality of circuit patterns are arranged in parallel to one another, and second dummy terminals, which are parallel to the circuit patterns and are provided at both end portions in an arrangement direction in which the circuit patterns are arranged. In the circuit board connecting structure, the first connecting portion and the second connecting portion are disposed in a face-to-face configuration via an adhesive agent. The first connecting portion and the second connecting portion are press-contacted with each other by being sandwiched by a pair of pressing jigs so that the circuit patterns are contacted with one another. The circuit board connecting structure is featured in that each of the first dummy terminals is accommodated between associated ones of the second dummy terminals.

The circuit board connecting structure is configured so that when the first connecting portion and the second connecting portion are press-contacted with each other, the first dummy terminal of the first connecting portion is accommodated between the second dummy terminals of the second connecting portion.

Thus, even when the first connecting portion (flexible base material) is softened and elongated along the direction of a surface thereof by being press-contacted, the first dummy terminal is prevented by the second dummy terminal from moving. Consequently, the elongation of the first connecting portion (flexible base material) can be restrained.

Consequently, each of the circuit patterns of the first connecting portion is positioned at or adjusted to a connecting position facing each of the circuit patterns of the second connecting portion. Accordingly, each of the circuit patterns of the first connecting portion can surely be connected to an associated one of the circuit patterns of the second connecting portion.

Further, the invention may be featured in that dummy terminals of one kind selected between the first dummy terminal and the second dummy terminal are disposed so as to be accommodated between columns on which a plurality of dummy terminals of the other kind selected between the first dummy terminal and the second dummy terminal are arranged at predetermined intervals at each of the end portions in the arrangement direction of the circuit patterns.

The dummy terminals of one kind selected between the first dummy terminal and the second dummy terminal are disposed so as to be accommodated between columns on which a plurality of dummy terminals of the other kind are arranged.

Thus, even when the first connecting portion (flexible base material) is softened and elongated along the direction of a surface thereof by being press-contacted, the first dummy terminal is prevented by the second dummy terminal from moving. Consequently, the elongation of the first connecting portion (flexible base material) can be restrained.

Furthermore, the dummy terminals of the one kind are disposed so as to be accommodated between columns on which a plurality of dummy terminals of the other kind are arranged. Thus, even in a case where the first connecting portion (flexible base material) is shrank along the direction of a surface thereof when the softened first connecting portion (flexible base material) is solidified by being cooled, the first dummy terminal is prevented by the second dummy terminal from moving. Consequently, the elongation and the shrinkage of the first connecting portion (flexible base material) can be restrained.

Accordingly, each of the circuit patterns of the first connecting portion is more favorably positioned at or adjusted to a connecting position facing each of the circuit patterns of the second connecting portion. Consequently, each of the circuit patterns of the first connecting portion can more surely be connected to an associated one of the circuit patterns of the second connecting portion.

Further, the invention may be featured in that the first dummy terminal and the second dummy terminal are provided at optional positions at an inner side in the arrangement direction of each of the circuit patterns.

Thus, a deflection can be restrained from occurring due to the elongation and the shrinkage of the first connecting portion (flexible base material) at the inner side in the arrangement direction of each of the circuit patterns.

Consequently, even at the inner side in the arrangement direction of the circuit patterns, each of the circuit patterns of the first connecting portion is more favorably positioned at or adjusted to a connecting position facing each of the circuit patterns of the second connecting portion. Accordingly, each of the circuit patterns of the first connecting portion can more surely be connected to an associated one of the circuit patterns of the second connecting portion.

Moreover, the invention may be featured in that dummy terminals of one kind selected between the first dummy terminal and the second dummy terminal are provided at equal intervals along the arrangement direction of the circuit patterns.

The intervals of the dummy terminals of one kind selected between the first dummy terminal and the second dummy terminal can be equalized in, e.g., the first connecting portion (flexible base material). Thus, a deflection generated in the first connecting portion (flexible base material) due to the elongation and the shrinkage thereof can uniformly been distributed to the intervals of the dummy terminals of the selected kind.

Consequently, each of the circuit patterns of the first connecting portion is favorably positioned at or adjusted to a connecting position facing each of the circuit patterns of the second connecting portion. Accordingly, each of the circuit patterns of the first connecting portion can more surely be connected to an associated one of the circuit patterns of the second connecting portion.

Furthermore, the invention may be featured in that one of the first dummy terminal and the second dummy terminal has a projecting part in a direction intersecting with the arrangement direction of the circuit patterns, and that the other of the first dummy terminal and the second dummy terminal has an accommodating portion that accommodates the projecting part.

Thus, when the first connecting portion (flexible base material) is softened and elongated, by accommodating the projecting part in the accommodating portion, the movement of the projecting part is prevented.

Consequently, the first connecting portion (flexible base material) can be prevented from moving in the longitudinal direction of the second connecting portion. Also, the first connecting portion (flexible base material) can be positioned in the longitudinal direction of the second connecting portion.

Further, the invention may be featured in that the adhesive agent is an anisotropic electrically conductive adhesive agent.

Alternatively, the invention may be featured in that the adhesive agent is an insulating adhesive agent.

Further, a circuit board connecting structure according to the invention includes a first circuit board having a first connecting portion, on the same surface of a flexible base material of which a plurality of circuit patterns are arranged in parallel to one another, and a second circuit board having a second connecting portion, on the same surface of a rigid base material of which a plurality of circuit patterns are arranged in parallel to one another. In the circuit board connecting structure, the first connecting portion and the second connecting portion are disposed in a face-to-face configuration via an adhesive agent. The first connecting portion and the second connecting portion are press-contacted with each other by being sandwiched by a pair of pressing jigs so that the circuit patterns are contacted with one another. The circuit board connecting structure is featured by comprising a regulating portion configured so that an outer end surface thereof directed outwardly in a parallel arrangement direction, in which the plurality of circuit patterns of the first connecting portion are arranged in parallel to one another, and an inner end surface thereof directed inwardly in a parallel arrangement direction, in which the plurality of circuit patterns of the second connecting portion are arranged in parallel to one another, are contacted with each other.

The circuit board connecting structure according to the invention is provided with the regulating portion configured so that the outer end surface thereof directed outwardly in the parallel arrangement direction, in which the plurality of circuit patterns of the first connecting portion are arranged in parallel to one another, and the inner end surface thereof directed inwardly in the parallel arrangement direction, in which the plurality of circuit patterns of the second connecting portion are arranged in parallel to one another, are contacted with each other.

Thus, even when the first connecting portion (flexible base material) is softened and elongated along the direction of a surface thereof by being press-contacted, the outer end surface is prevented by the inner end surface from moving. Consequently, the elongation of the first connecting portion (flexible base material) can be restrained.

Accordingly, each of the circuit patterns of the first connecting portion is positioned at or adjusted to a connecting position facing each of the circuit patterns of the second connecting portion. Consequently, each of the circuit patterns of the first connecting portion can surely be connected to an associated one of the circuit patterns of the second connecting portion.

Further, the invention may be featured in that the circuit pattern of the first connecting portion includes a pair of branch patterns into which an associated one of the circuit patterns of the first connecting portion is branched from a predetermined place to a leading end, and that the circuit pattern of the second connecting portion are disposed between the branch patterns.

The circuit patterns of the second connecting portion are disposed between the pair of branch patterns provided in the circuit pattern of the first connecting portion.

Thus, both the elongation and the shrinkage of the first connecting portion (flexible base material) can be restrained. Consequently, each of the circuit patterns of the first connecting portion can more surely be connected to an associated one of the circuit patterns of the second connecting portion.

In addition, a conduction area can be increased by disposing the circuit pattern of the second connecting portion between the pair of branch patterns provided in the first connecting portion. Accordingly, electric characteristics can be improved.

Further, the invention may be featured in that the branch patterns are connected to each other with plating so that the flexible base material is not exposed from between the branch patterns.

A plated part is contacted with the top surface of the circuit pattern of the second connecting portion by connecting the branch patterns with the plating.

Thus, the three surfaces, i.e., both the side end surfaces and the top surface of each of the second circuit patterns of the second connecting portion are brought into contact with the associated first circuit pattern of the first connecting portion. Consequently, the conduction area therebetween can be further increased. Accordingly, the electric characteristics can be further improved.

Furthermore, the invention may be featured in that the branch patterns and the circuit pattern of the second connecting portion, which is disposed between the branch patterns, are cross-sectionally substantially trapezoidal, and that an end surface of each of the branch patterns and an associated end surface of the circuit pattern of the second connecting portion are put into surface-to-surface contact with each other.

Each of the branch patterns is cross-sectionally substantially trapezoidal-shaped (wedge-shaped). In addition, the circuit pattern of the second connecting portion, which is disposed between the branch patterns, is cross-sectionally substantially trapezoidal-shaped (wedge-shaped). Then, end surfaces of the cross-sectionally substantially trapezoidal-shaped branch patterns are put into surface-to-surface contact with those of the cross-sectionally substantially trapezoidal-shaped circuit pattern.

Thus, the wedge-shaped end surfaces are in surface-to-surface contact with each other. Consequently, the circuit pattern of the second connecting portion can surely be contacted with the branch patterns.

Moreover, the invention may be featured in that one of the circuit pattern of the second connecting portion, which is disposed between the branch patterns, and each of the branch patterns is cross-sectionally substantially trapezoidal, and that an end surface of each of the branch patterns and an associated end surface of the circuit pattern of the second connecting portion are put into surface-to-surface contact with each other by press-fitting the circuit pattern of the second connecting portion into between the branch patterns.

One of the circuit patterns of the second connecting portion, which is disposed between the branch patterns, and each of the branch patterns is cross-sectionally substantially trapezoidal. The circuit pattern of the second connecting portion is press-fit into the branch patterns. Thus, the end surface of one of the patterns abuts against that of the other pattern and is deformed.

The end surface of one of the patterns abuts against that of the other pattern, so that the end surfaces of the branch patterns and the circuit pattern of the second connecting portion are put into surface-to-surface contact with each other.

Further, the invention may be featured in that one of the circuit pattern of the first connecting portion and that of the second connecting portion has an erected wall portion, which is continuous to a horizontal portion, and is cross-sectionally substantial L-shaped.

One of the circuit pattern of the first connecting portion and that of the second connecting portion is cross-sectionally substantial L-shaped. Thus, the contact area between the circuit patterns can be increased.

Consequently, the conduction area can be increased while the elongation of the first connecting portion (flexible base material) is prevented.

Moreover, the invention may be featured in that the circuit patterns of the first connecting portion, which are provided at both end portions in an arrangement direction in which the circuit patterns of the first connecting portion are arranged, are cross-sectionally substantial L-shaped, and that the outer end surface is provided by the erected wall portion.

Furthermore, the invention may be featured in that the circuit patterns of the second connecting portion, which are provided at both end portions in an arrangement direction in which the circuit patterns of the second connecting portion are arranged, are cross-sectionally substantial L-shaped, and that the inner end surface is provided by the erected wall portion.

According to such features of the invention, the erected wall portion constituting the circuit pattern is the regulating portion. Thus, the elongation of the flexible base material can surely be restrained.

Advantages Of The Invention

According to the invention, when the first connecting portion (flexible base material) and the second connecting portion are press-contacted with each other, the first dummy terminal is prevented by the second dummy terminal from moving. Thus, the flexible base material is restrained from being elongated. Consequently, the invention has an advantage that the connection between circuit patterns can surely be obtained.

BRIEF DESCRIPTION OF THE DRAWINGS

FIG. 21 is a perspective view illustrating a conventional circuit board connecting structure that is in a state before this circuit board connecting structure connects circuit boards to each other.

DESCRIPTION OF REFERENCE NUMERALS AND SIGNS

Figure 1:
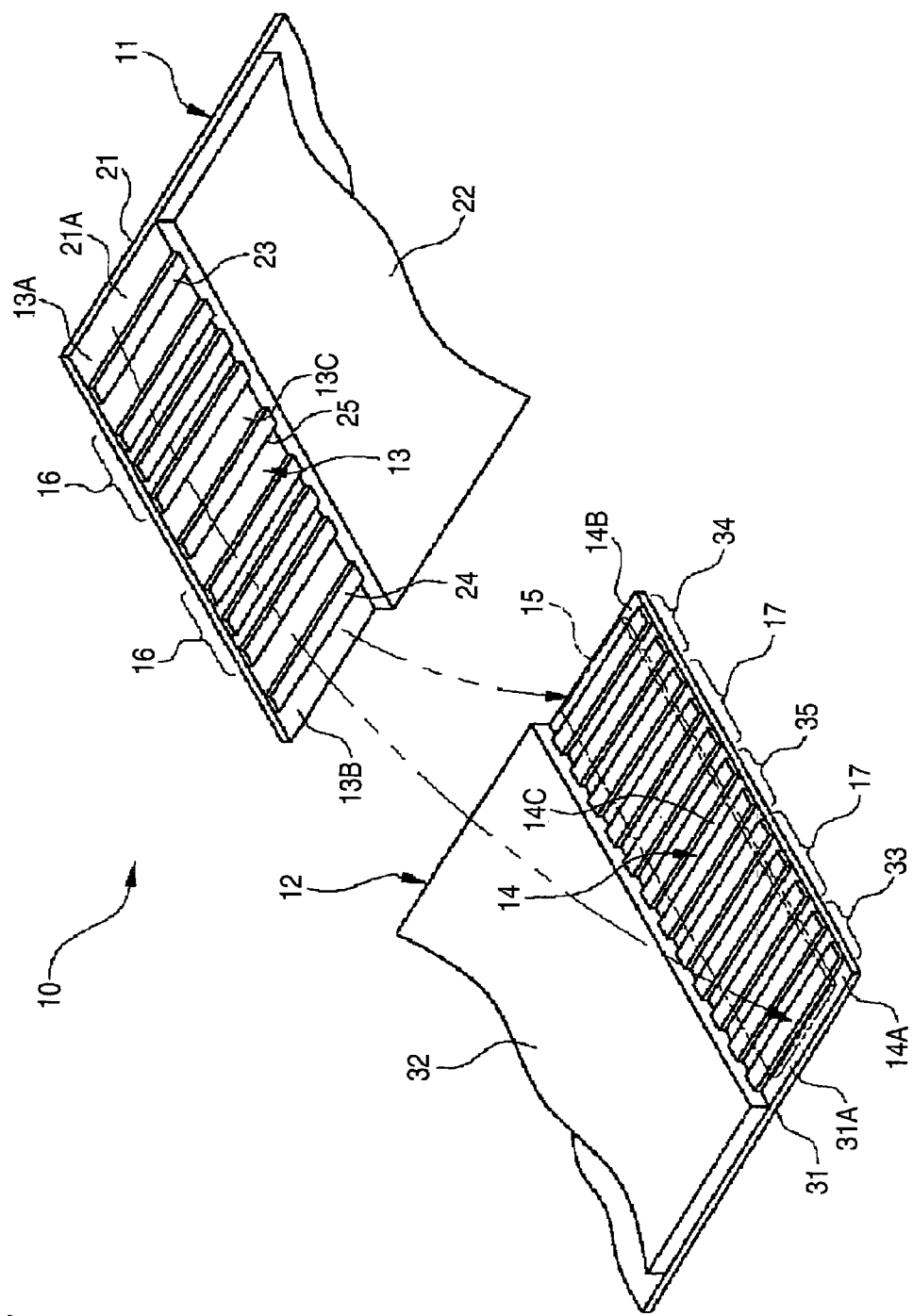
FIG. 1 is a perspective view illustrating a circuit board connecting structure (first embodiment) according to the invention, which is in a state before this circuit board connecting structure connects circuit boards to each other.

10, 40, 50, 60, 70, 80, 90, 110, 120, 130, 140 circuit board connecting structures
11, 91 first circuit board
12, 95 second circuit board
13, 92 first connecting portions
13A, 13B both end portions in an arrangement direction of each first circuit pattern
13C, 14C center positions (optional positions)
14, 96 second connecting portions
14A, 14B both end portions in an arrangement direction of each second circuit pattern
15 adhesive agent
16, 93, 131 first circuit patterns (circuit patterns)
27, 97, 132 second circuit patterns (circuit patterns)
18, 19 pair of pressing jigs
21 flexible base material
21A surface of a flexible base material (same surface)
23, 24 first outer dummy terminals (first dummy terminals)
25 first inner dummy terminal (first dummy terminal)
31 rigid base material
31A surface of a rigid base material (same surface)
33, 34 second outer dummy terminals (first dummy terminals)
35 second inner dummy terminals (first dummy terminals)
41, 42, 61 projecting parts
43, 62 accommodating portions
97A inner end surface (end surface)
97B outer end surface (end surface)
98, 121 branch patterns
98A outer end surface (end surface)
98B inner end surface (end surface)
100, 133 regulating portions
111, 112 plating
121A corner portion 121B contact surface
131B erected wall portion (outer end surface)
132B inner end surface

BEST MODE FOR CARRYING OUT THE INVENTION

First Embodiment

Figure 2:
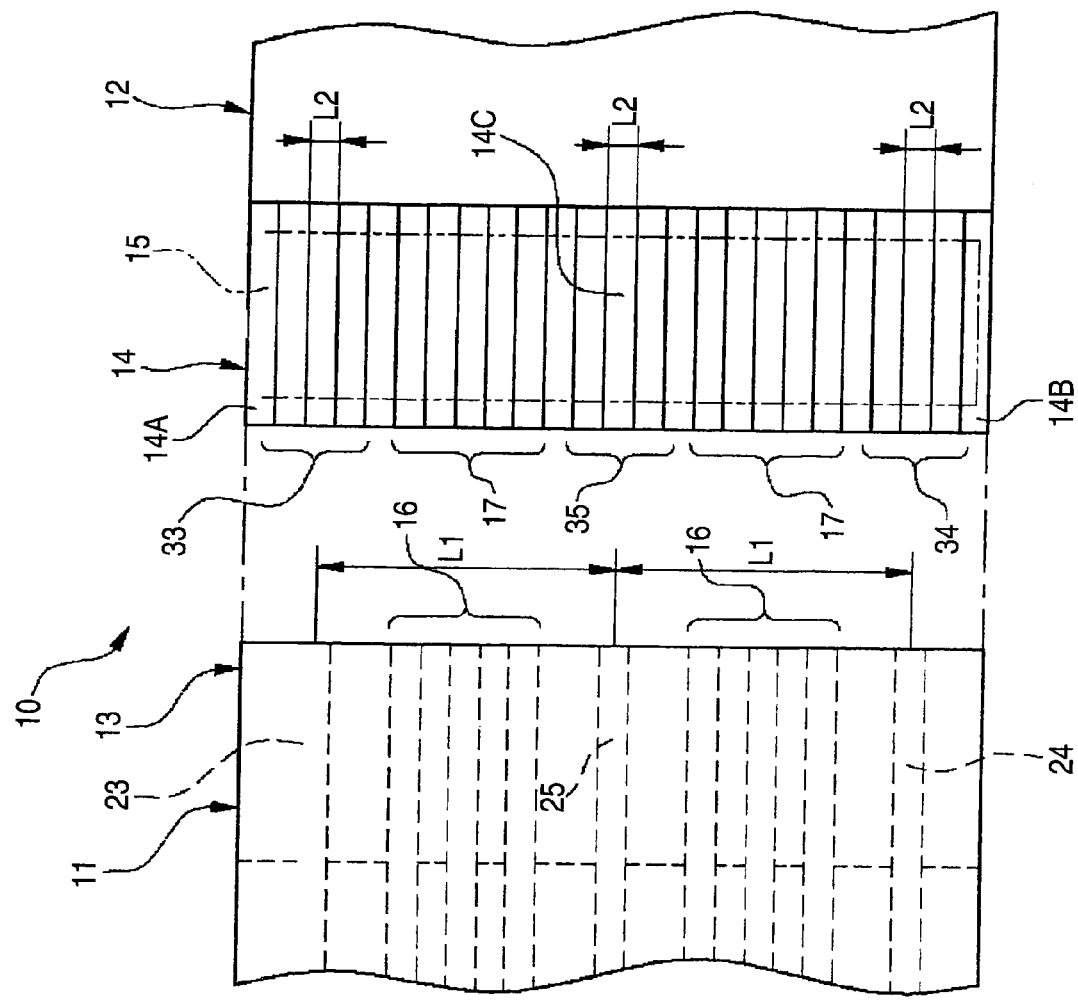
FIG. 2 is a plan view illustrating the circuit board connecting structure according to the first embodiment, which is in a state before this circuit board connecting structure connects circuit boards to each other.

As illustrated in FIGS. 1 and 2, a first circuit board connecting structure 10 according to a first embodiment includes a first circuit board 11 and a second circuit board 12. A first connecting portion 13 of the first circuit board 11 and a second connecting portion 14 of the second circuit board 12 are arranged in a face-to-face configuration via an adhesive agent 15. Additionally, the first connecting portion 13 and the second connecting portion 14 are press-contacted with each other by being sandwiched with a pair of pressing jigs 18 and 19 (see FIG. 3) so that a first circuit pattern (circuit pattern) 16 of the first connecting portion 13 and a second circuit pattern (circuit pattern) 17 of the second connecting portion 14 are contacted with each other.

The first circuit board 11 is such that a plurality of first circuit patterns 16 are disposed in parallel to one another along a longitudinal direction on a surface (same surface) 21A of a flexible base material 21, and that the plurality of first circuit patterns 16 are protected by a coverlay 22 and have the first connecting portion 13 at an end portion.

The first connecting portion 13 is such that a first outer dummy terminal (first dummy terminal) 23, which is parallel to the first circuit pattern 16, is provided on one 13A of both end portions 13A and 13B in an arrangement direction of each of the first circuit patterns 16, and that a first outer dummy terminal (first dummy terminal) 24, which is parallel to the first circuit pattern 16, is provided on the other end portion 13B.

Hereinafter, a description is given by referring the first outer dummy terminal 23 and the first outer dummy terminal 24 as "one of first outer dummy terminals" and "the other first outer dummy terminal", respectively.

Further, the first connecting portion 13 is such that a first inner dummy terminal (first dummy terminal) 25, which is parallel to each of the first circuit patterns 16, is provided on an optional position 13C at the inner side in an arrangement direction of each of the first circuit patterns 16.

Hereinafter, in the first embodiment, the center position is exemplified as an example of the optional position 13C. Thus, the first outer dummy terminals 23 and 24, and the first inner dummy terminal 25 are provided along the direction of arrangement of the first circuit patterns 16 at uniform intervals.

Consequently, the interval between one of the first outer dummy terminals 23 and the first inner dummy terminal 25 and that between the other first outer dummy terminal 24 and the first inner dummy terminal 25 have an equal dimension L1 (see FIG. 2).

Three of the first circuit patterns 16 are disposed in the interval from the one 23 of the first outer dummy terminals 23 to the first inner dummy terminal 25 as an example.

Three of the first circuit patterns 16 are disposed in the interval between the other first outer dummy terminals 24 and the first inner dummy terminal 25 as an example.

The second circuit board 12 is such that a plurality of second circuit patterns 17 are disposed in parallel to one another along a longitudinal direction on a surface (same surface) 31A of a rigid base material 31, and that the plurality of second circuit patterns 17 are protected by a solder resists 32 and have the second connecting portion 14 at an end portion.

The second connecting portion 14 is such that a plurality of (i.e., two) second outer dummy terminals (second dummy terminals) 33, which are parallel to the second circuit pattern 17, are provided on one 14A of both end portions 14A and 14B in an arrangement direction, and that a plurality of (i.e., two) second outer dummy terminals (second dummy terminals) 34, which are parallel to the second circuit pattern 17, is provided on the other end portion 14B.

Hereinafter, a description is given by referring to the second outer dummy terminals 33, 33 as "ones of first outer dummy terminals" and by referring to each of first outer dummy terminals 34, 34 as "the other ones of first outer dummy terminals".

The ones of first outer dummy terminals 33, 33 are provided at a predetermined interval L2 (see FIG. 2). The other ones of first outer dummy terminals 34, 34 are provided at the predetermined L2 (see FIG. 2).

The predetermined interval L2 is an interval at which the first other dummy terminals 23, 24 can be accommodated.

Further, the second connecting portion 14 is such that a plurality of (two) second inner dummy terminals (second dummy terminals) 35, which are parallel to each of the second circuit patterns 17, is provided on an optional position 14C at the inner side in an arrangement direction of each of the first circuit patterns 17.

The second inner dummy terminals 35, 35 are provided at the predetermined interval L2 (see FIG. 2).

The predetermined interval L2 is an interval at which the first inner dummy terminals 25 can be accommodated.

Hereinafter, in the first embodiment, the center position is exemplified as an example of the optional position 14C.

This circuit board connecting structure 10 is configured so that the one 23 of the first outer dummy terminals is accommodated between the columns of the ones of the second outer dummy terminals 33, 33 and that the other 24 of the first outer dummy terminals is accommodated between the columns of the ones of the second outer dummy terminals 34, 34.

Additionally, the circuit board connecting structure 10 is configured so that the first inner dummy terminal 25 on the center position 13C is accommodated between the columns of the second inner dummy terminals 35, 35 on the center position 14C.

Three of the second circuit patterns 17 are disposed in the interval from the one 33 of the second outer dummy terminals to the second inner dummy terminal 35.

Three of the second circuit patterns 17 are disposed in the interval between the other second outer dummy terminal 34 and the second inner dummy terminal 35 as an example.

The second circuit patterns 17 of the second connecting portion 14 and the first circuit patterns 16 of the first connecting portion 13 are arranged so that each of the second circuit patterns 17 and an associated one of the first circuit patterns 16 face each other when the first connecting portion 14 and the second connecting portion 13 are arranged in a face-to-face configuration.

An anisotropic electrically conductive adhesive agent and an insulating adhesive agent are used as the adhesive agent 15 by way of example. This adhesive agent can be applied onto or printed on the second connecting portion like a sheet.

The adhesive agent 15 is softened or liquefied when the first connecting portion 13 and the second connecting portion 14 are heated to press-contact the first connecting portion 13 and the second connecting portion 14 with each other.

Figure 3:
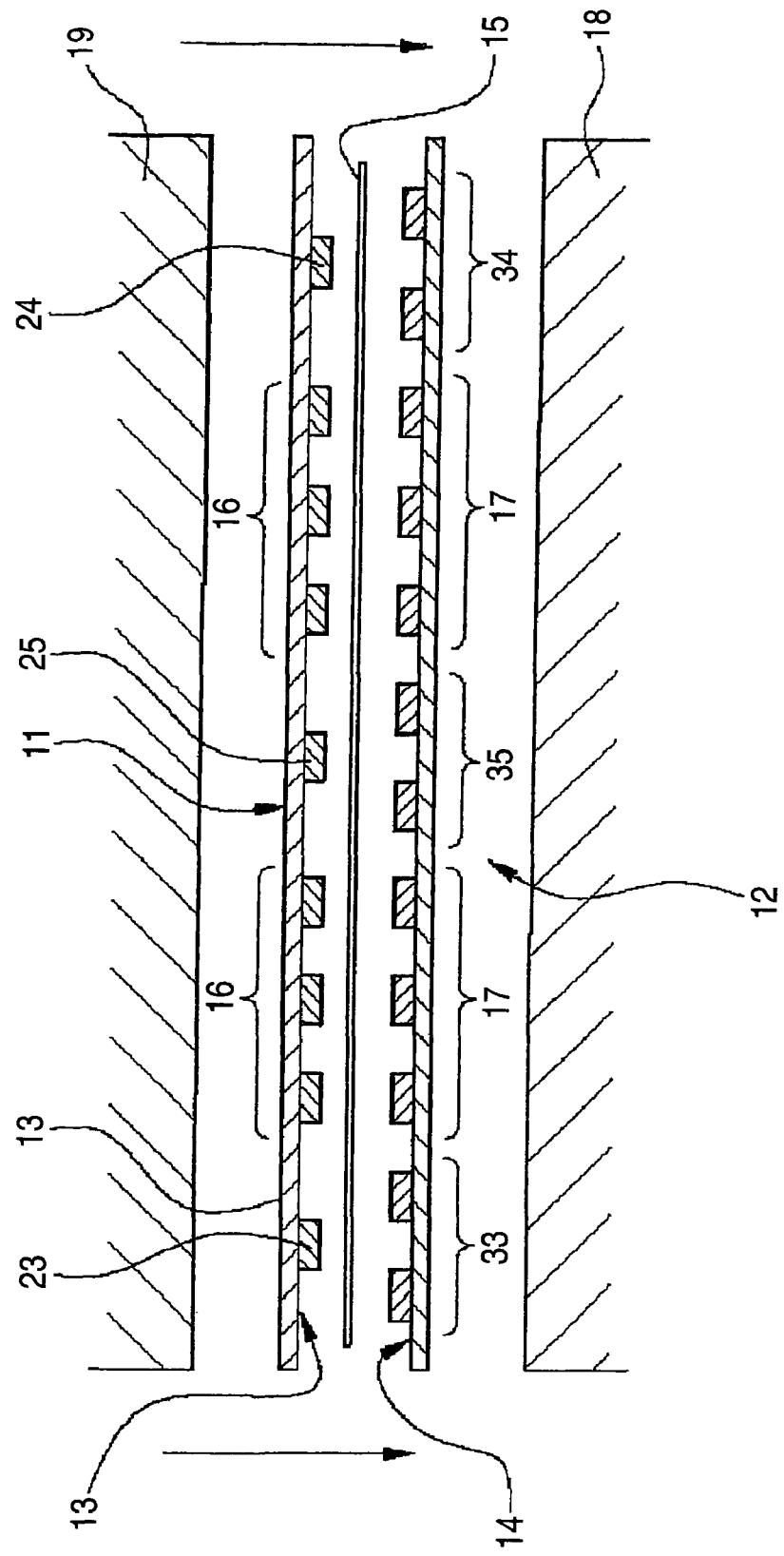
FIG. 3 is a view illustrating a process of press-contacting the circuit board connecting structure according to the first embodiment.

As illustrated in FIG. 3, one of the pair of pressing jigs 18 and 19 is the fixed jig 18. The other pressing jig is the moving jig 19.

Next, a process of press-contacting the first connecting portion 13 and the second connecting portion 14 of the circuit board connecting structure 10 with each other is described below based on FIG. 3, FIG. 4.

As illustrated in FIG. 3, the fixed jig 18 and the moving jig 19 are opened. The first connecting portion 13 of the first circuit board 11 and the second connecting portion 14 of the second circuit board 12 are disposed in a face-to-face configuration via the adhesive agent 15 between the fixed jig 18 and the moving jig 19, which have been opened.

The moving jig 19 is moved in the direction of an arrow so as to press the flexible member 21 of the first circuit board 11 with the moving jig 19 in the direction of the arrow.

At that time, the adhesive agent 15 is softened or liquefied by heating the first connecting portion 13 and the second connecting portion 14.

Figure 4:
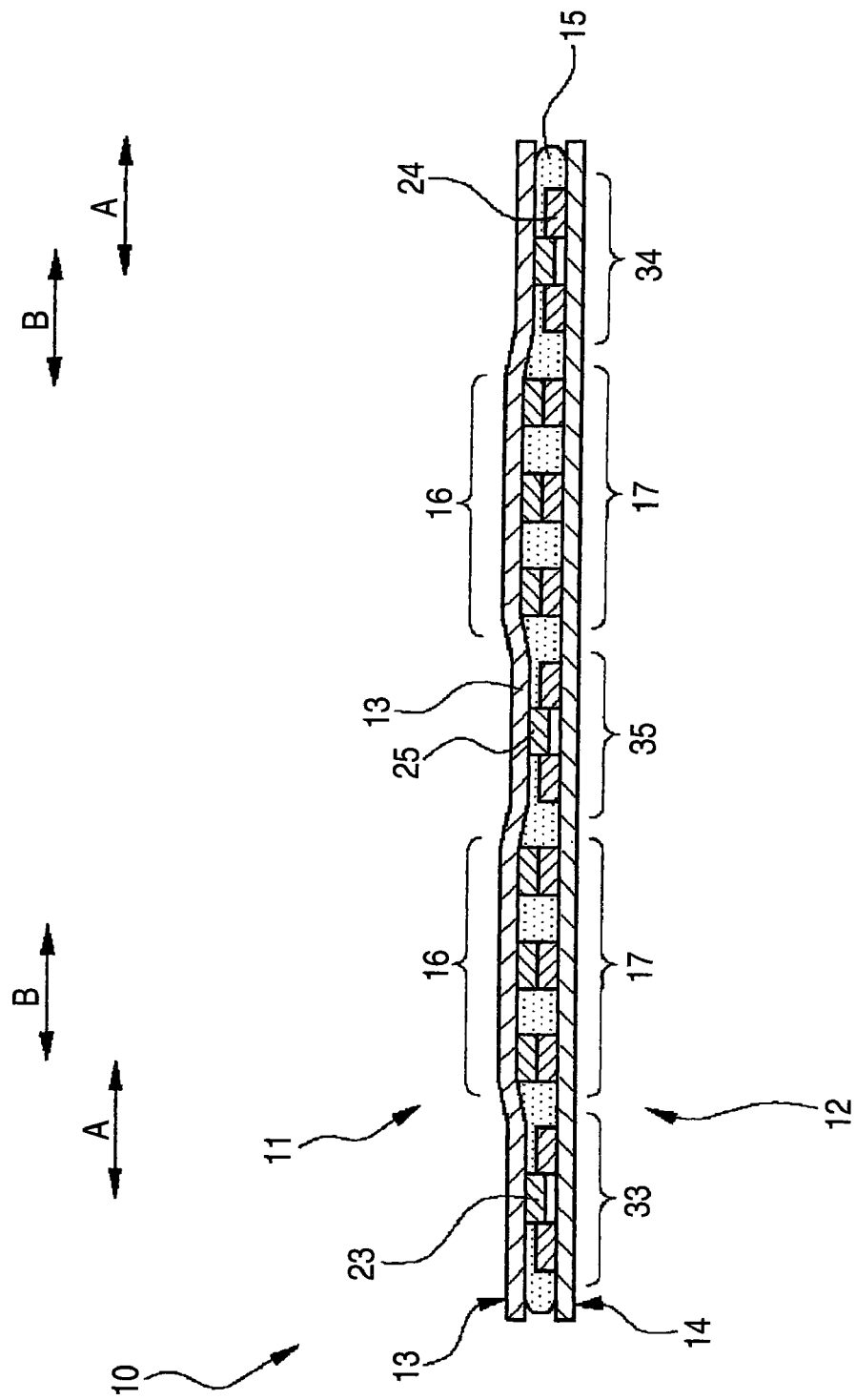
FIG. 4 is a view illustrating a state in which the circuit board connecting structure according to the first embodiment is press-contacted.

As illustrated in FIG. 4, one 23 of the first outer dummy terminals is accommodated between the ones of the second outer dummy terminals 33, 33. Further, the other first outer dummy terminal 24 is accommodated between the columns of the other ones of the second outer dummy terminals 34, 34.

In addition, the first inner dummy terminal 25 on the center position 13C is accommodated between the columns of the second inner dummy terminals 35, 35 on the center position 15.

Simultaneously, each of the first circuit patterns 16 is moved towards an associated one of the second circuit patterns 17. Accordingly, the adhesive agent 15 intervening between the first circuit patterns 16 and the second circuit patterns 17 is extruded from between the first circuit patterns 16 and the second circuit patterns 17. Subsequently, by being heated, the adhesive agent 15 is hardened.

Each of the first circuit patterns 16 and an associated one of the second circuit patterns 17 are electrically contacted with each other. Additionally, the first connecting portion 13 and the second connecting portion 14 are connected to each other by the adhesive agent 15.

Consequently, the process of process of press-contacting the first connecting portion 13 and the second connecting portion 14 with each other is completed.

At this stage, when the first connecting portion 13 and the second connecting portion 14 are press-contacted with each other, the first connecting portion (flexible base material) 13 can be softened with press-contacting, and can be elongated along the direction of the surface thereof.

Thus, the one 23 of the first outer dummy terminals is accommodated between the columns of the ones of the second outer dummy terminals 33, 33. The other 24 of the first outer dummy terminals is accommodated between the columns of the other ones of the second outer dummy terminals 34, 34.

Consequently, even when the first connecting portion (flexible base material) 13 is softened and elongated along the direction of the surface thereof by being press-contacted, the movement in the direction of each arrow A of the first outer dummy terminals 23, 24 can be prevented by the second outer dummy terminals 33, 34. Thus, the elongation of the first connecting portion (flexible base material) 13 can be restrained.

Moreover, the one 23 of the first outer dummy terminal 23 is accommodated between the columns of the ones of the second outer dummy terminals 33, 33. The other first outer dummy terminal 24 is accommodated between the columns of the other ones of the second outer dummy terminals 34, 34.

Consequently, even when the softened first connecting portion (flexible base material) 13 shrinks along the surface thereof with cooling, the movement in the direction of each arrow B of the first outer dummy terminals 23, 24 can be prevented by the second outer dummy terminals 33, 34. The shrinkage of the first connecting portion (flexible base material) 13 can be restrained.

Furthermore, the first inner dummy terminal 25 on the center position 13C is accommodated between the column of the second inner dummy terminals 35 and 35 on the central position 13C.

Accordingly, a deflection can be prevented from occurring due to the elongation and the shrinkage of the first connecting portion (flexible base material) 13 at the inner side (i.e., on the center position 13C) in the arrangement direction of each of the first circuit patterns 16.

Consequently, each of the circuit patterns 16 of the first connecting portion 13 can favorably be positioned at or aligned to a connecting position facing an associated one of the second circuit patterns 17 of the second connecting portion 14.

In addition, the interval from the one 23 of the first outer dummy terminals to the first inner dummy terminal 25 and that from the first outer dummy terminal 24 to the first inner dummy terminal 25 are set at the same dimension L1.

Accordingly, the deflection occurring due to the elongation and the shrinkage of the first connecting portion (flexible base material) 13 can equally be distributed between the interval from the one 23 of the first outer dummy terminal to the first inner dummy terminal 25 and that from the other first outer dummy terminal 24 to the first inner dummy terminal 25.

Consequently, each of the first circuit patterns 16 of the first connecting portion 13 can favorably be positioned at or adjusted to a connecting position facing an associated one of the second circuit patterns 17 of the second connecting portion 14.

As described above, according to the circuit board connecting structure 10 of the first embodiment, the movement of the first outer dummy terminals 23, 24 and the first inner dummy terminal 25 can be prevented by the second outer dummy terminals 33 and 34 and the second inner dummy terminal 35 when the first connecting portion (flexible base material) 13 and the second connecting portion 14 are press-contacted with each other.

Therefore, each of the first circuit patterns 16 and an associated one of the second circuit patterns 17 can be electrically and surely connected to each other by restraining the elongation and the shrinkage of the first connecting portion (flexible base material) 13.

Next, circuit board connecting structures according to second to sixth embodiments are described below with reference to FIGS. 5 to 9.

Incidentally, in the second to sixth embodiments, members similar to those of the first embodiment are designated with reference numerals used to denote those of the first embodiment. Thus, the description of such members is omitted.

Second Embodiment

Figure 5:
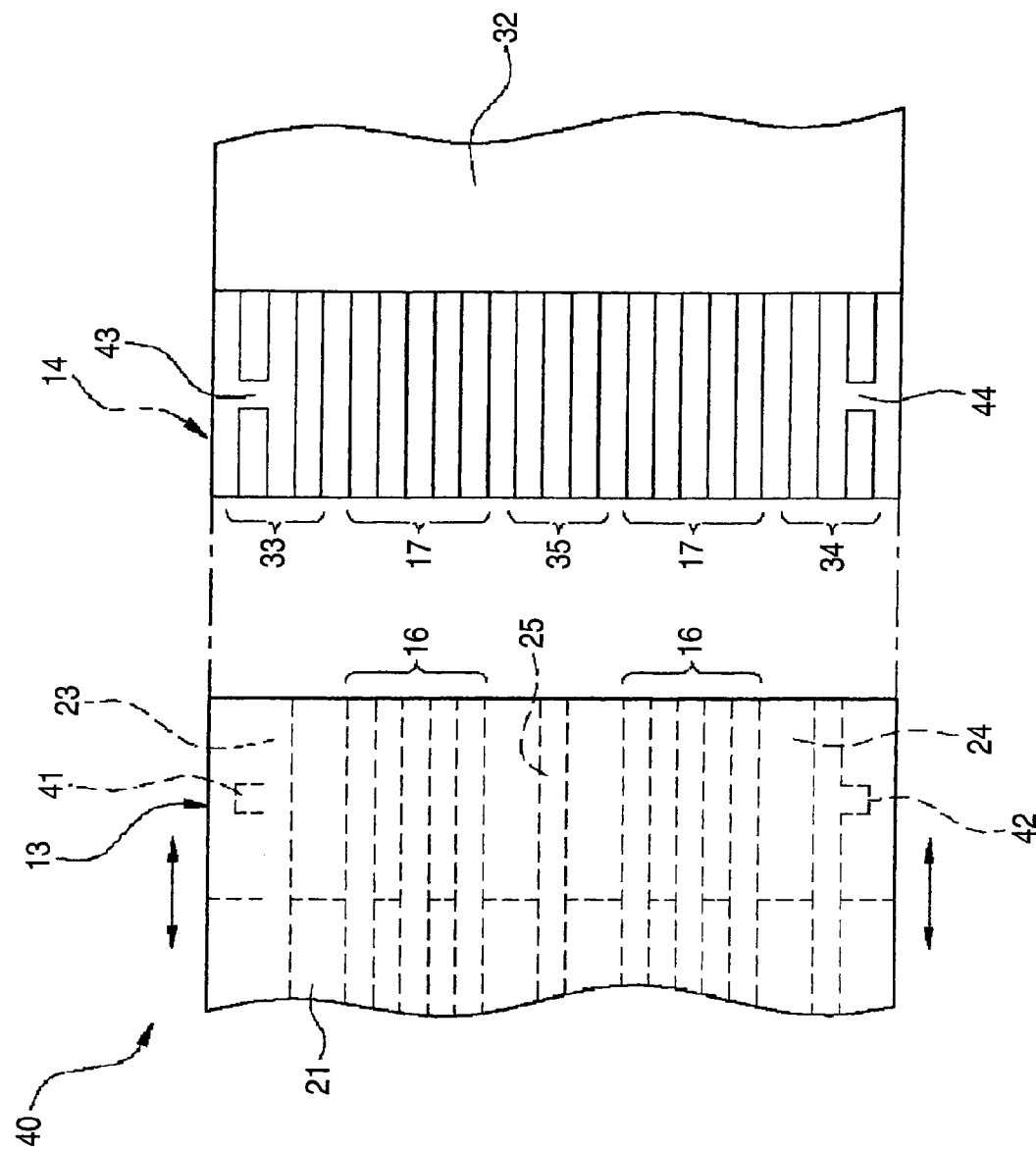
FIG. 5 is a plan view illustrating a circuit board connecting structure according to a second embodiment, which is in a state before this circuit board connecting structure connects circuit boards to each other.

As illustrated in FIG. 5, a circuit board connecting structure 40 according to a second embodiment is configured so that the first connecting portion 13 includes projecting parts 41 and 42, and that the second connecting portion 14 includes accommodating portions 43 and 44. The remaining components of the connecting structure according to the second embodiment are similar to those of the connecting structure 10 according to the first embodiment.

More specifically, the one 23 of the first outer dummy terminals includes one of outwardly projecting parts (projecting parts) 41, which is provided in a direction (intersecting direction) perpendicular to the arrangement direction of each of the first circuit patterns 16. The one 41 of projecting parts is formed like a rectangle.

Further, the connecting structure includes one 43 of accommodating portions (accommodating portions), which accommodates the projecting part 41 and is provided in an outer one 33 of the ones 33, 33 of the second outer dummy terminals.

Furthermore, the other first outer dummy terminal 24 includes the other outwardly projecting part (projecting part) 42, which is provided in a direction (intersecting direction) perpendicular to the arrangement direction of each of the first circuit patterns 16. The other projecting part 42 is formed like a rectangle.

Moreover, the connecting structure includes the other accommodating portion (accommodating portion) 44, which accommodates the projecting part 42 and is provided in an outer one 34 of the other ones 34, 34 of the second outer dummy terminals.

The one 41 of the projecting parts is accommodated in the one 43 of the accommodating portions 43. Thus, when the first connecting portion (flexible base material) 13 is softened and elongated, the movement in the direction of arrows (longitudinal direction) of the one 41 of the projecting parts is prevented by the one 43 of the accommodating portions.

Similarly, the other projecting part 42 is accommodated in the other accommodating portion 44. Thus, when the first connecting portion (flexible base material) 13 is softened and elongated, the movement in the direction of arrows (longitudinal direction) of the other projecting part 42 is prevented by the other accommodating portion 44.

Accordingly, the first connecting portion (flexible base material) 13 prevents the movement in the longitudinal direction of the second connecting portion 14. Consequently, the first connecting portion (flexible base material) 13 can be positioned in the longitudinal direction of the second connecting portion 14.

Further, according to the circuit board connecting structure 40 according to the second embodiment, advantages similar to those of the circuit board connecting structure 10 according to the first embodiment.

Incidentally, in the second embodiment, there has been described an example of forming each of the one 41 of the projecting part and the other projecting part 42 like a rectangle. The shape of the projecting parts according to the second embodiment is not limited thereto. The one 41 of the projecting part and the other projecting part 42 can be formed into another shape, e.g., a triangle, or a trapezoid.

Furthermore, in the second embodiment, the one 41 of the projecting parts and the other projecting part 42 are projected in the direction perpendicular to the arrangement direction of each of the first circuit patterns 16. However, the direction, in which the projecting parts are projected, according to the invention is not limited thereto. The projecting parts can be projected obliquely to the arrangement direction of each of the first circuit patterns 16.

In short, it is sufficient that the one 41 of the projecting parts and the other projecting part 42 are projected in the direction perpendicular to the arrangement direction of each of the first circuit patterns 16.

Third Embodiment

Figure 6:
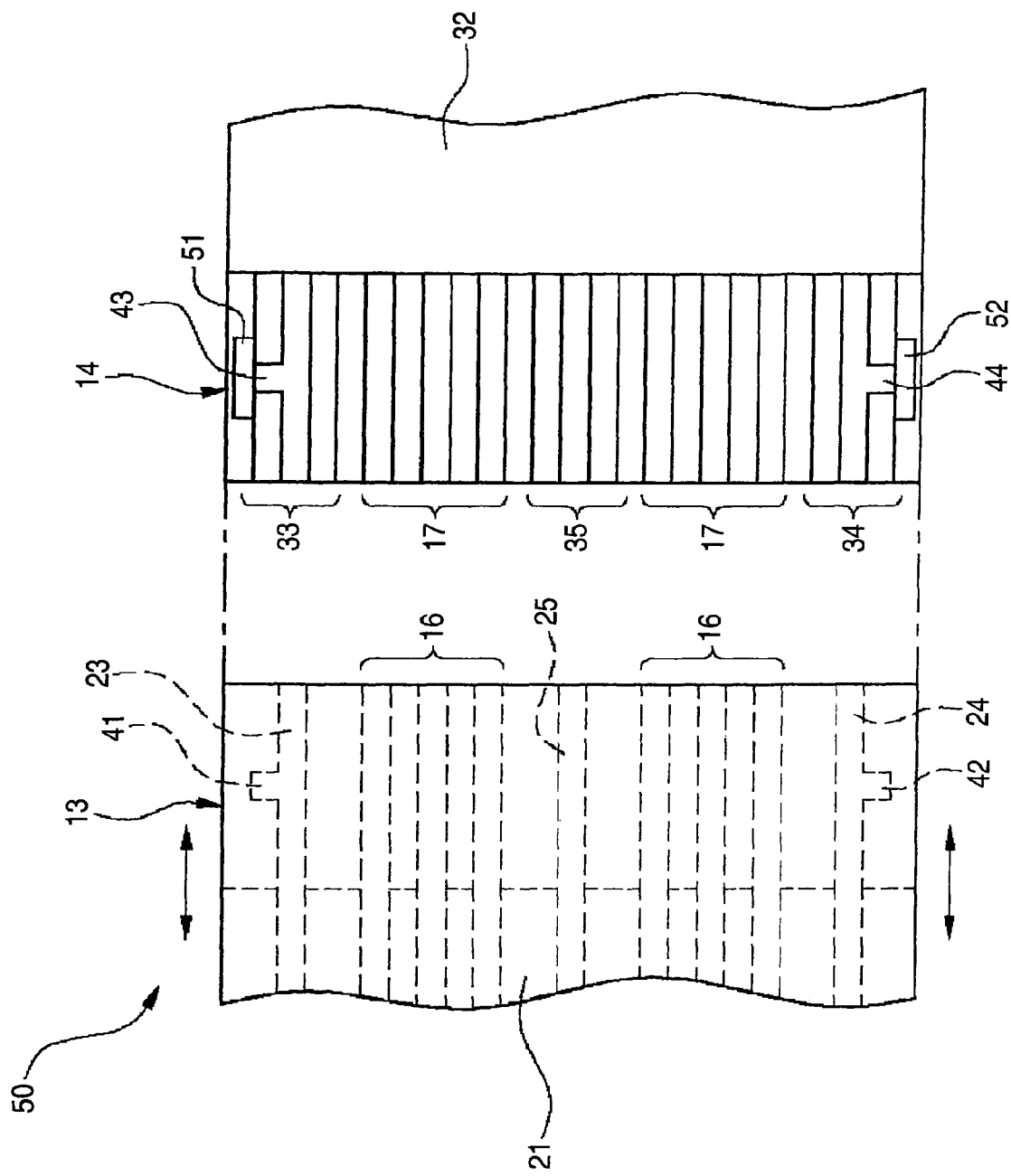
FIG. 6 is a plan view illustrating a circuit board connecting structure according to a third embodiment, which is in a state before this circuit board connecting structure connects circuit boards to each other.

As illustrated in FIG. 6, a circuit board connecting structure 50 according to a third embodiment is configured so that accommodating portions 43 and 44 of a second connecting portion 14 have wall parts 51 and 52, respectively. The remaining components of the connecting structure according to the third embodiment are similar to those of the connecting structure 40 according to the second embodiment.

More particularly, an outer one 33 of the ones 33, 33 of the second outer dummy terminals has one 43 of the accommodating portions. In addition, the outer one 33 of the ones 33, 33 of the second outer dummy terminals has one 51 of the wall parts.

The outer one 33 of the ones 33, 33 of the second outer dummy terminals has one 51 of the wall parts. Thus, the one 43 of the accommodating portions is concavely formed. In addition, parts of the outer one 33 of the second outer dummy terminals are connected integrally with each other by the one 51 of the wall parts.

Additionally, an outer one 34 of the other ones of the second outer dummy terminals 34, 34 has one 44 of the accommodating portions. The outer one 34 of the other ones of the second outer dummy terminals 34, 34 has the other wall part 52.

The outer one 34 of the ones 34, 34 of the second outer dummy terminals has the other wall part 52. Thus, the other accommodating portion 44 is concavely formed. In addition, parts of the outer one 34 of the second outer dummy terminals are connected integrally with each other by the other wall part 52.

Consequently, each of the outer ones 33, 34 of the dummy terminals is integrally connected to an associated one of the accommodating portions 43 and 44. Thus, electrolytic plating can be performed. That is, each of the terminals can be formed so as to have a stable thickness, which is thicker than the thickness of a nonelectrolytically plated one. Accordingly, when the connecting portions are press-contacted with each other, the aforementioned movement of the terminals can be more strongly prevented.

Additionally, according to the circuit board connecting structure 50 of the third embodiment, advantages similar to those of the circuit board connecting structure 40 of the second embodiment.

Fourth Embodiment

Figure 7:
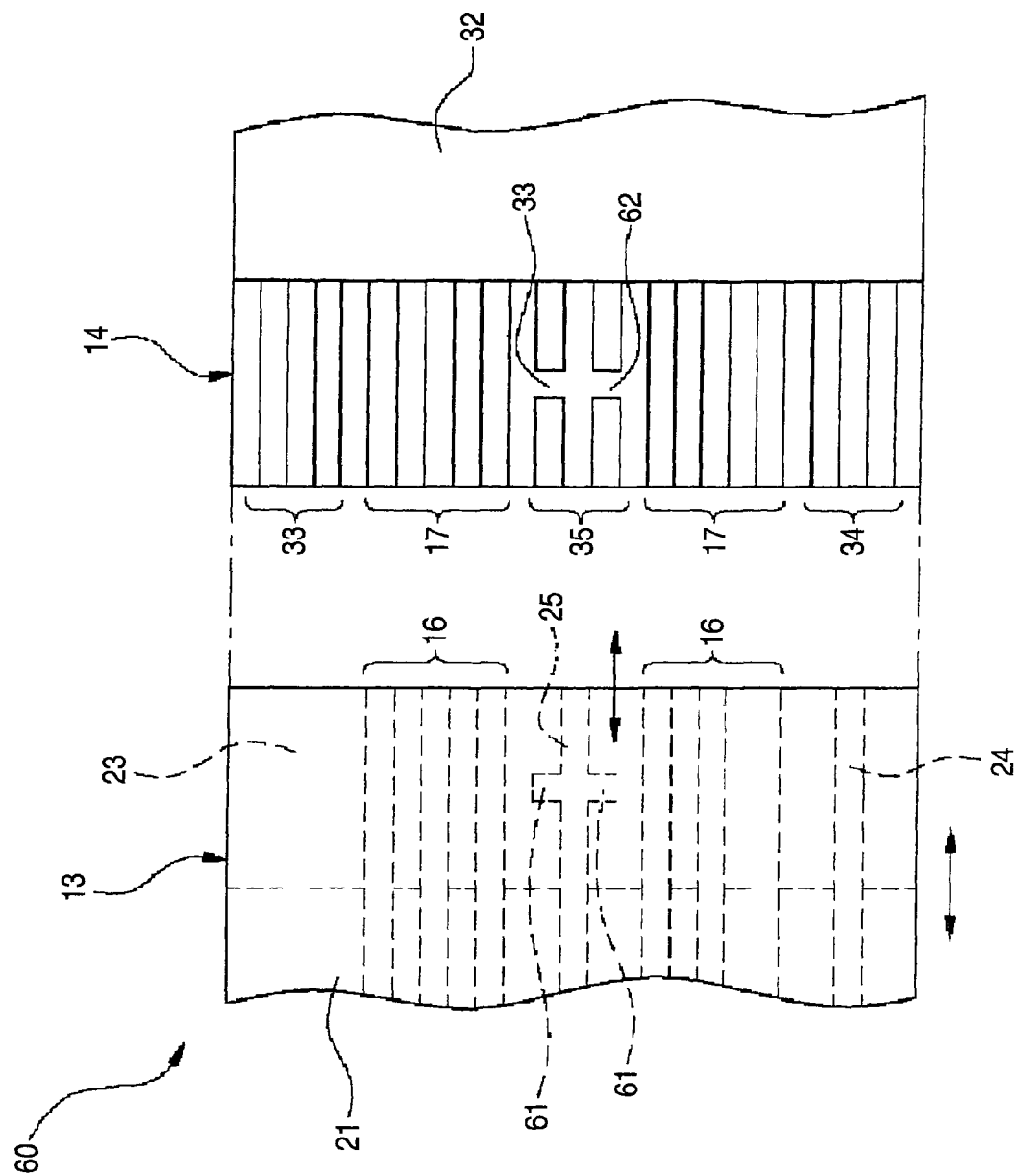
FIG. 7 is a plan view illustrating a circuit board connecting structure according to a fourth embodiment, which is in a state before this circuit board connecting structure connects circuit boards to each other.

As illustrated in FIG. 7, a circuit board connecting structure 60 according to a fourth embodiment is configured so that a first connecting portion 13 has a projecting part 61, and that a second connecting portion 14 has an accommodating portion 62. The remaining components of the connecting structure according to the fourth embodiment are similar to those of the connecting structure 40 according to the second embodiment.

More specifically, a first inner dummy terminal 25 has a pair of outwardly projecting parts 61 provided in a direction perpendicular to the arrangement direction of each of the first circuit patterns 16. The paired projecting parts 61 are shaped like a rectangle.

Further, the paired second inner dummy terminals 35 respectively have accommodating portions 62 each of which accommodates an associated one of the projecting parts 61.

The pair of projecting parts 61 are respectively accommodated in the accommodating portions 62, respectively. Thus, when the first connecting portion (flexible base material) 13 is softened and elongated, the movement in the direction of each arrow of the pair of projecting parts 61 can be prevented by each of the accommodating portions 62.

Accordingly, the first connecting portion (flexible base material) 13 prevents the second connecting portion 14 from moving in the longitudinal direction. Consequently, the first connecting portion (flexible base material) 13 can be positioned in the longitudinal direction of the second connecting portion 14.

Additionally, according to the circuit board connecting structure 60 of the fourth embodiment, advantages similar to those of the circuit board connecting structure 40 according to the second embodiment.

Incidentally, in the fourth embodiment, there has been described an example of forming each of the pair of projecting parts 61 like a rectangle. The shape of the projecting parts according to the fourth embodiment is not limited thereto. The pair of projecting parts 61 can be formed into another shape, e.g., a triangle, or a trapezoid.

Further, in the fourth embodiment, the pair of the projecting parts 61 is projected in the direction perpendicular to the arrangement direction of each of the first circuit patterns 16. However, the direction, in which the projecting parts are projected, according to the invention is not limited thereto. The projecting parts can be projected obliquely to the arrangement direction of each of the first circuit patterns 16.

In short, it is sufficient that the paired projecting parts 61 are projected in the direction perpendicular to the arrangement direction of each of the first circuit pattern 16.

Fifth Embodiment

Figure 8:
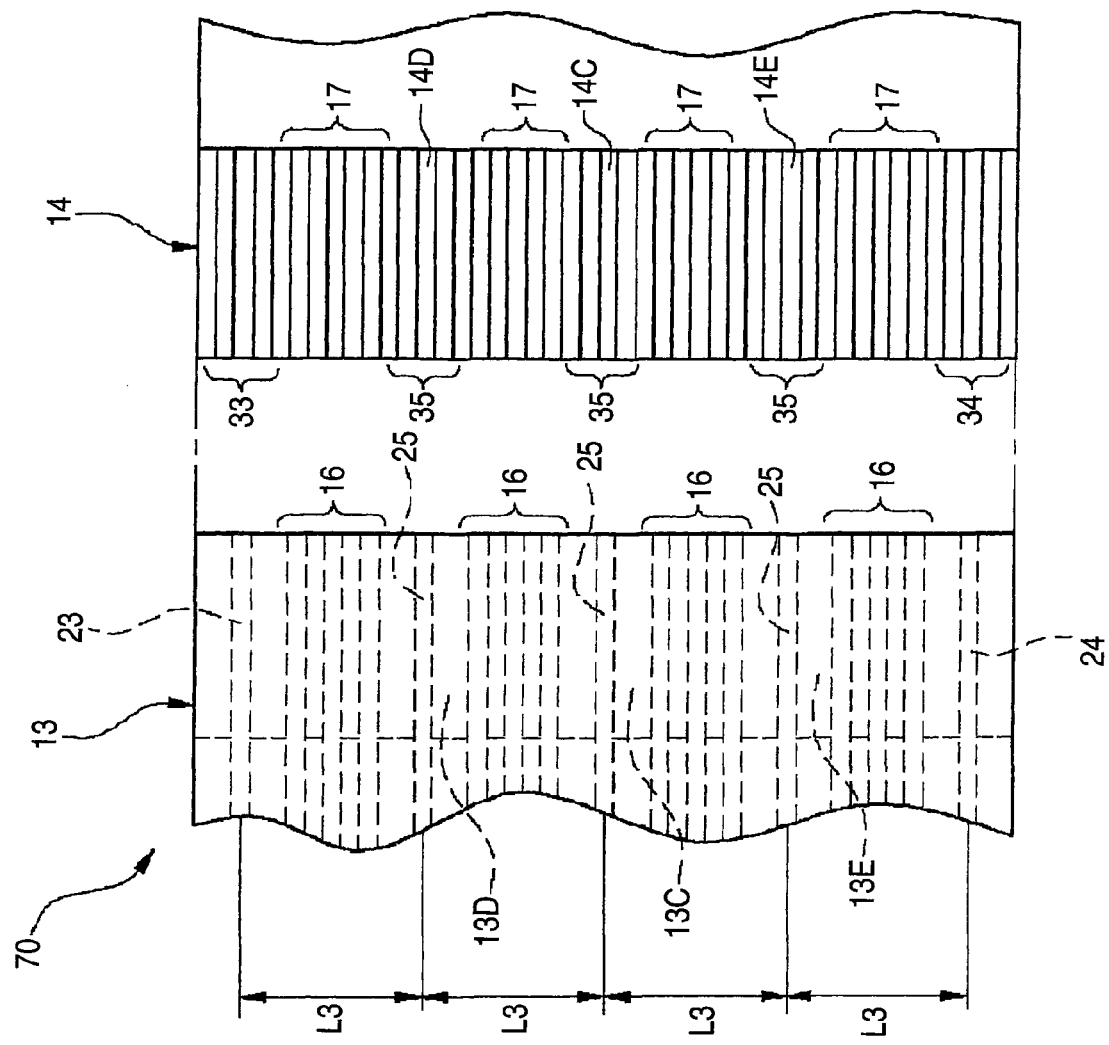
FIG. 8 is a plan view illustrating a circuit board connecting structure according to a fifth embodiment, which is in a state before this circuit board connecting structure connects circuit boards to each other.

As illustrated in FIG. 8, a circuit board connecting structure 70 according to a fifth embodiment is configured so that a plurality of (e.g., three) first inner dummy terminals 25 are provided at an inner side in the arrangement direction of each of the first circuit patterns 16 in the first connecting portion 13. The remaining components of the connecting structure according to the fifth embodiment are similar to those of the connecting structure 10 according to the first embodiment.

More particularly, the first connecting portion 13 is configured so that the first inner dummy terminals 25, which is parallel to each of the first circuit patterns 16, are provided on the center position 13C, and optional positions 13D and 13E at an inner side in the arrangement direction of each of the first circuit patterns 16, respectively.

Incidentally, the first outer dummy terminals 23, 25 and the first inner dummy terminals 25, 25, 25 are provided at equal intervals L3.

Further, the second connecting portion 14 is configured so that a plurality of (i.e., two) second inner dummy terminals 35, which are parallel to each of the second circuit patterns 17, are provided on a center position (optional position) 14C at the inner side in the arrangement direction of each of the first circuit patterns 17.

The second connecting portion is configured so that the first inner dummy terminal 25 provided on the center position 13C is accommodated between the columns of the second inner dummy terminals 35, 35 provided on the center position 14C.

Moreover, the second connecting portion 14 is configured so that a plurality of (i.e., two) second inner dummy terminals 35, which are parallel to each of the second circuit patterns 17, are provided on an optional position 14D at the inner side in the arrangement direction of each of the first circuit patterns 17.

The second connecting portion 14 is configured so that the first inner dummy terminal 25 on the optical position 13D is accommodated between the columns of the second inner dummy terminals 35, 35 on the optical position 14D.

In addition, the second connecting portion 14 is such that a plurality of (i.e., two) second inner dummy terminals 35, which are in parallel to the second circuit pattern 17, are provided at an optional position 14E at an inner side in the arrangement direction of each of the first circuit patterns 17.

The second connecting portion 14 is configured so that the first inner dummy terminal 25 on an optional position 13E is accommodated between the columns of the second inner dummy terminals 35, 35 on the optional position 14E.

According to the circuit board connecting structure 70 of the fifth embodiment, the plurality of (e.g., three) first inner dummy terminals 25 are provided in the first connecting portion 13. The plurality of first inner dummy terminals 25 are constrained by the second inner dummy terminals 35. Consequently, the fifth embodiment can effectively address a case where the number of circuit patterns is large, and where the width of the first connecting portion 13 has a large dimension.

Additionally, according to the circuit board connecting structure 70 of the fifth embodiment, advantages similar to those of the circuit board connecting structure 10 according to the fifth embodiment can be obtained.

Sixth Embodiment

Figure 9:
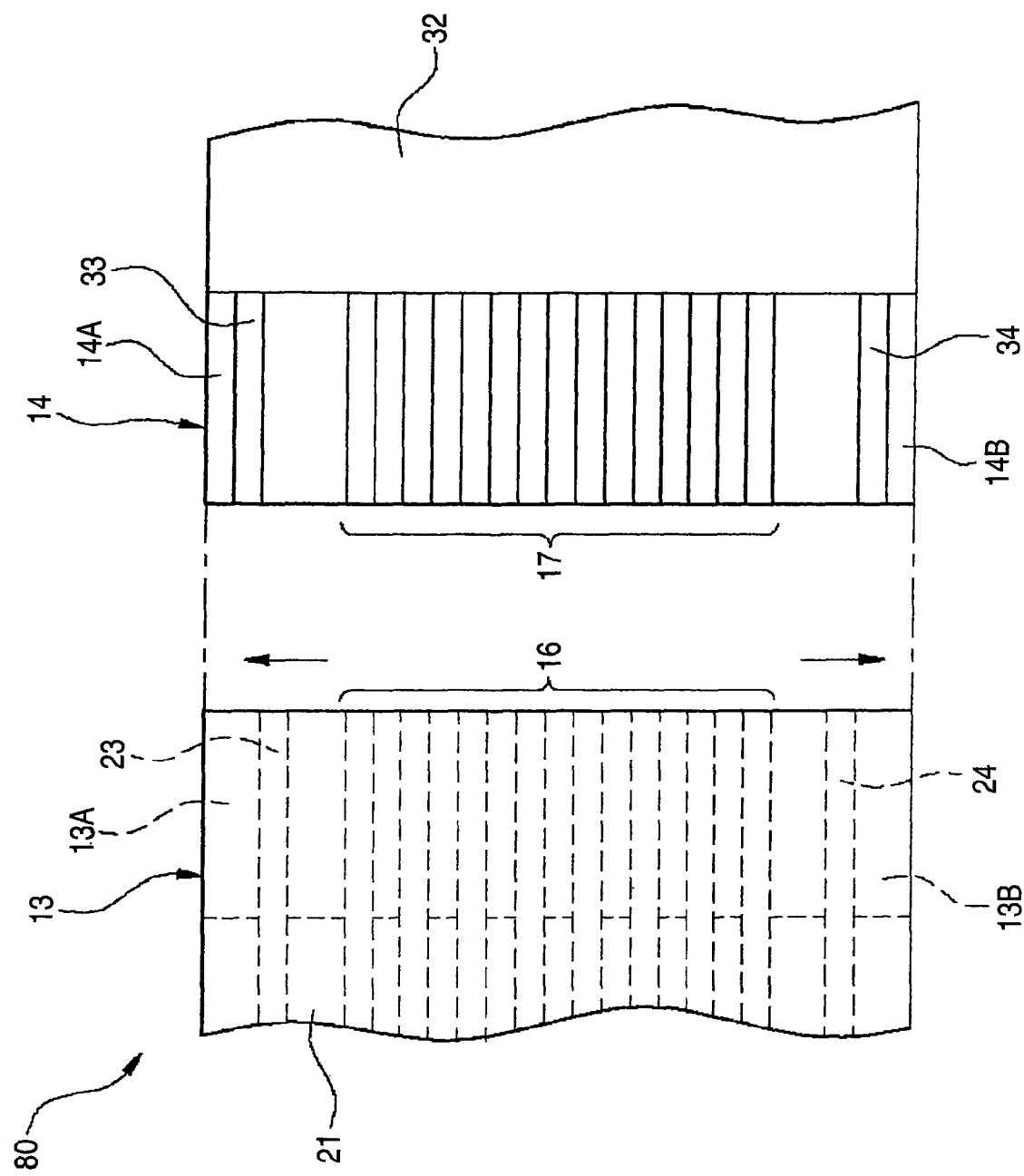
FIG. 9 is a plan view illustrating a circuit board connecting structure according to a sixth embodiment, which is in a state before this circuit board connecting structure connects circuit boards to each other.

As illustrated in FIG. 9, a circuit board connecting structure 80 according to a sixth embodiment is configured so that first outer dummy terminals 23, 24 are provided at both end portions 13A, 13B of the first connecting portion 13, respectively, and that second outer dummy terminals 33, 34 are provided at both end portions 14A, 14B of the second connecting portion 14. The remaining components of the connecting structure according to the sixth embodiment are similar to those of the connecting structure 10 according to the first embodiment.

More particularly, the first outer dummy terminal 13, which is parallel to each of the first circuit patterns 16, is provided at an end portion 13A in the arrangement direction of each of the first circuit patterns 16.

Further, the first connecting portion 13 is such that the first outer dummy terminal 24, which is parallel to each of the first circuit patterns 16, is provided at an end portion 13B in the arrangement direction of each of the first circuit patterns 16.

Furthermore, the second connecting portion 14 is such that the second outer dummy 33, which is parallel to each of the second circuit patterns 17, is provided at an end portion 14A in the arrangement direction of each of the second circuit patterns 17.

In addition, the second connecting portion 14 is such that the second outer dummy 34, which is parallel to each of the second circuit patterns 17, is provided at an end portion 14B in the arrangement direction of each of the second circuit patterns 17.

Further, the paired first outer dummy terminals 23, 24 are disposed so as to be accommodated between the second dummy terminals 33, 34.

Accordingly, when the first connecting portion 13 and the second connecting portion 14 are press-contacted with each other, the pair of first other dummy terminals 23, 24 can be accommodated between the pair of second dummy terminals 33, 34.

Consequently, even when the first connecting portion (flexible base material) 13 is softened and elongated along the direction of the surface thereof by being press-contacted, the movement in the direction of an arrow of the first dummy terminal 23 is prevented by the second dummy terminal 33. In addition, the movement in the direction of an arrow of the first dummy terminal 24 is prevented by the second dummy terminal 34. Thus, the elongation of the first connecting portion (flexible base material) 13 can be restrained.

Thus, each of the first circuit patterns 16 of the first connecting portion 13 is positioned at or adjusted to a connecting position facing each of the second circuit patterns of the second connecting portion 14. Consequently, each of the first circuit patterns 16 can be electrically and surely connected to an associated one of the second circuit patterns 17.

Seventh Embodiment

Figure 10:
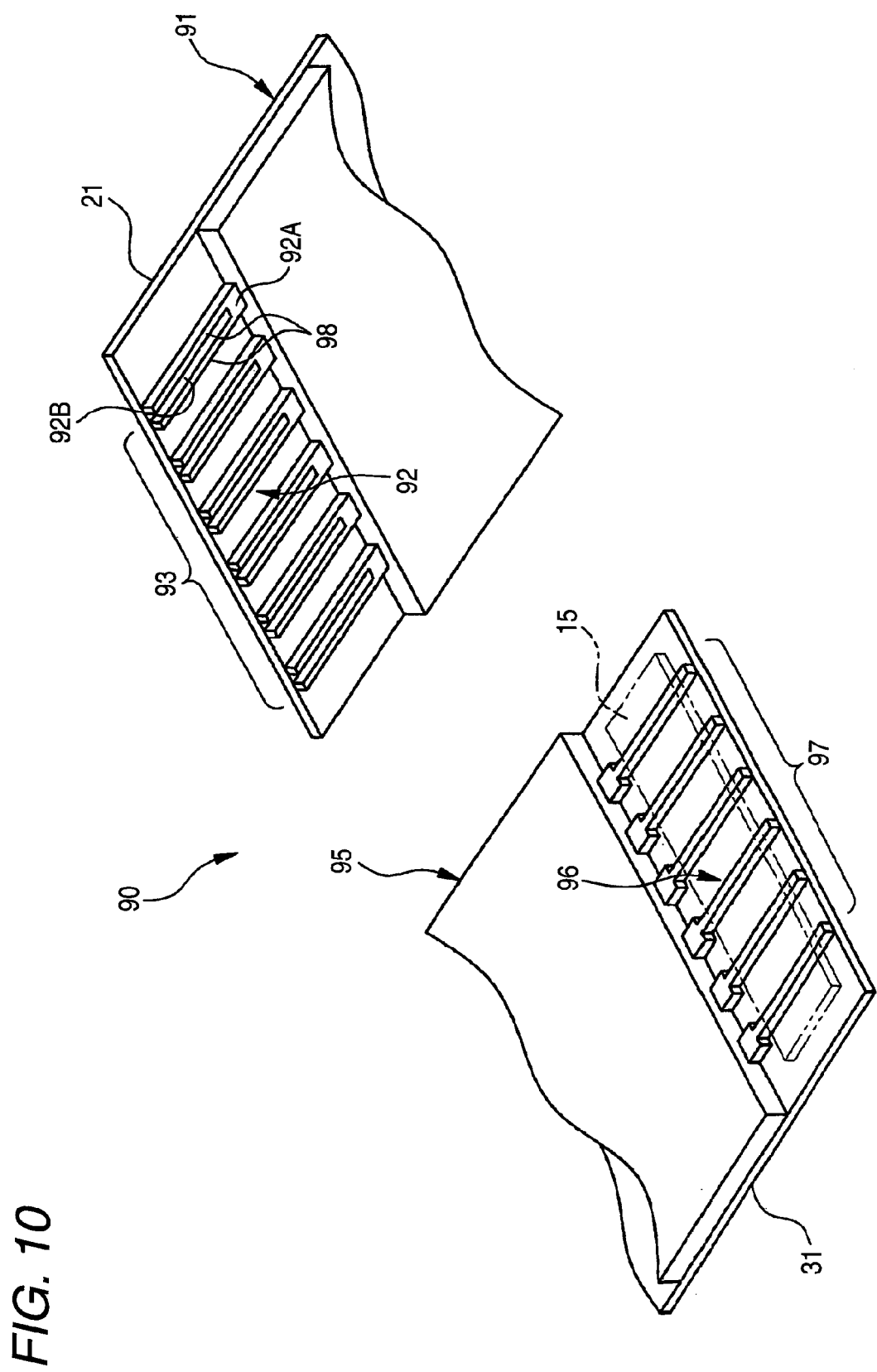
FIG. 10 is a perspective view illustrating a circuit board connecting structure (seventh embodiment) according to the invention, which is in a state before this circuit board connecting structure connects circuit boards to each other.

As illustrated in FIG. 10, a circuit board connecting structure 90 according to a seventh embodiment includes a first circuit board 91 having a first connecting portion 92 in which a plurality of first circuit patterns (circuit patterns) 93 are disposed in parallel with one another on the same surface of a flexible base material 21, and includes also a second circuit board 95 having a second connecting portion 96 in which a plurality of second circuit patterns (circuit patterns) 97 are disposed in parallel with one another on the same surface of a rigid base material 31.

Further, the circuit board connecting structure 90 is such that the first connecting portion 92 and the second connecting portion 96 are disposed in a face-to-face configuration via an adhesive agent 15, and that the first connecting portion 92 and the second connecting portion 96 are press-contacted with each other by being sandwiched by a pair of pressing jigs 18, 19 (see FIG. 3) so as to bring each of the first circuit patterns 93 into contact with each other.

Figure 11:
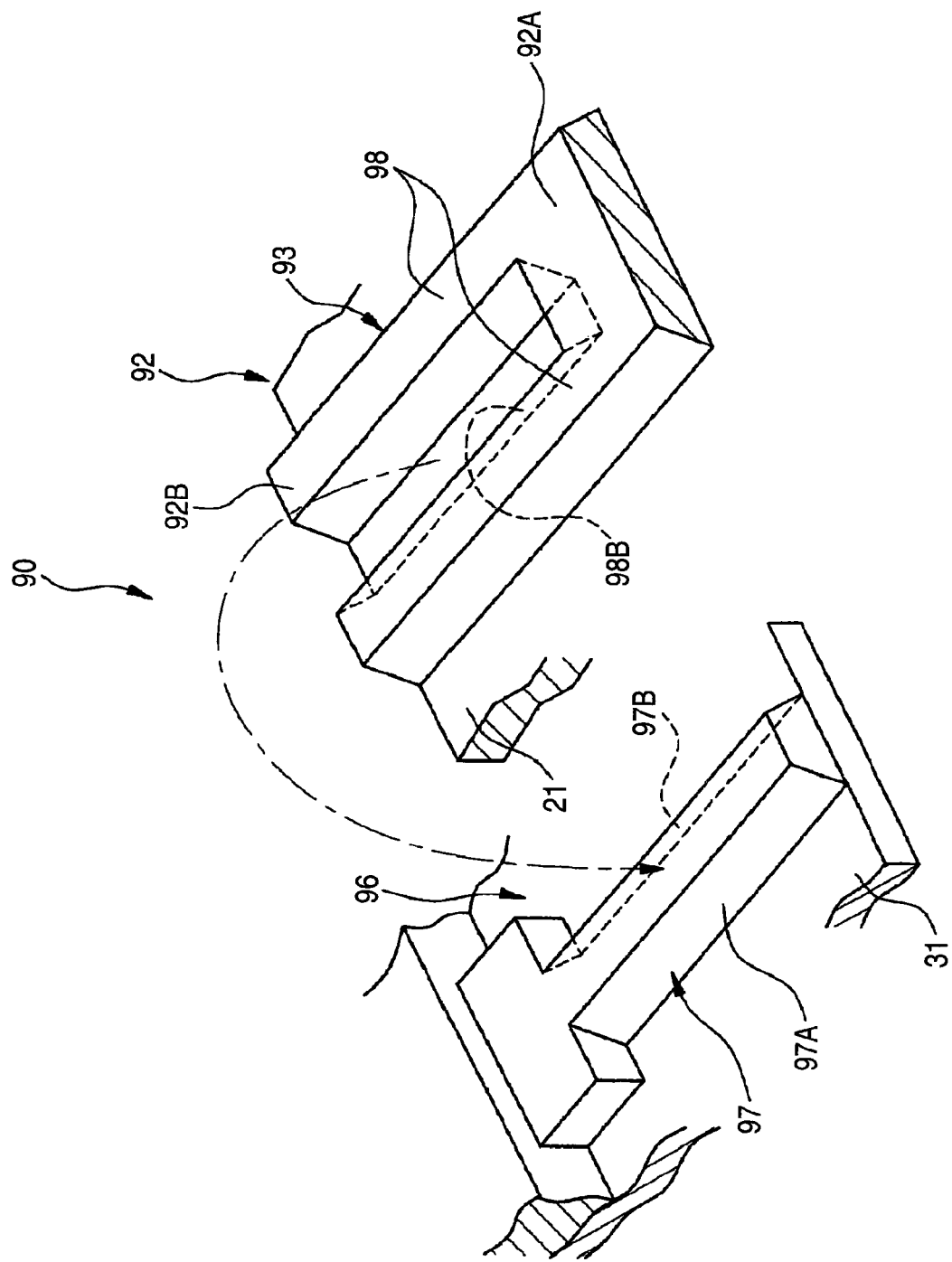
FIG. 11 is perspective view illustrating a primary part of the circuit board connecting structure according to the seventh embodiment, which is in a state before this circuit board connecting structure connects circuit boards to each other.
Figure 12:
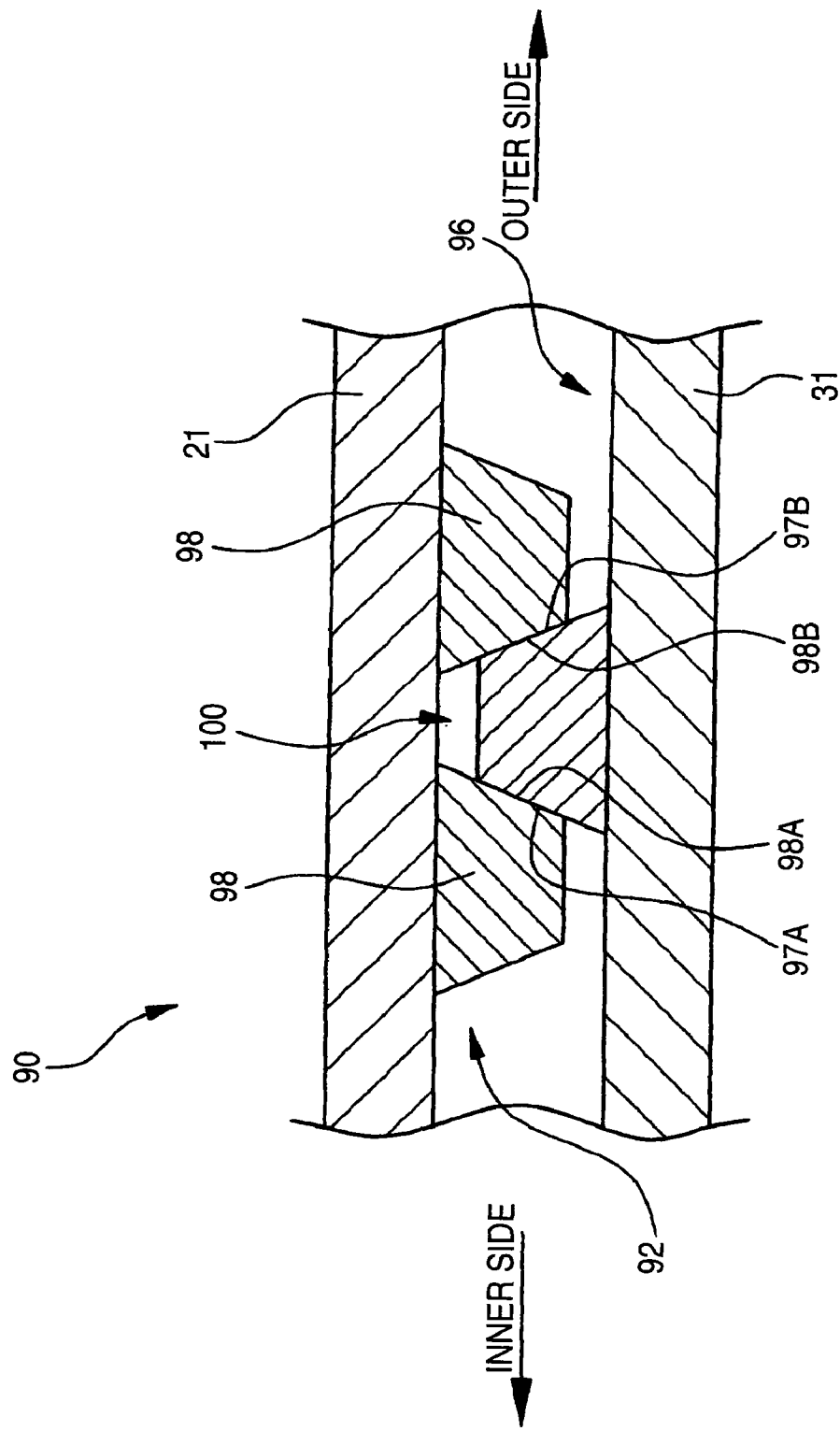
FIG. 12 is perspective view illustrating the primary part of the circuit board connecting structure according to the seventh embodiment, which is in a state after this circuit board connecting structure connects circuit boards to each other.

As illustrated in FIGS. 11 and 12, the circuit board connecting structure 90 includes a pair of branch patterns 98, into which each of the first circuit patterns 93 of the first connecting portion 92 is branched, from a predetermined place 93A to a leading end 93B. An associated one of second circuit patterns 97 of the second connecting portion 96 is disposed between each pair of the branch patterns 98

As illustrated in FIG. 12, the circuit board connecting structure 90 is such that each of the branch patterns 98 of the first connecting portion 92 and the second circuit patterns 97 of the second connecting portion 96 is cross-sectionally substantially trapezoidal, and that end surfaces 98A and 98B of each of the branch patterns 98 are put into surface-to-surface contact with end surfaces 97A and 97B of an associated one of the second circuit patterns 97, respectively.

More specifically, the outer end surface (end surface) 98A of one of the pair of branch patterns 98, which is outwardly directed in a direction in which the pair of branch patterns 98 are arranged in parallel with each other, is brought into surface-to-surface contact with the inner end surface (end surface) 97A of an associated one of the second circuit patterns 97, which is inwardly directed in a direction in which the second circuit patterns 97 are arranged in parallel with each other.

Incidentally, a portion of a configuration, in which the outer end surface 98A of each of the branch patterns 98 is contacted with the inner end surface 97A of an associated one of the second circuit patterns 97, and in which the inner end surface 98B thereof is contacted with the outer end surface 97B of the associated one of the second circuit patterns 97, is a regulating portion 100.

That is, according to the circuit board connecting structure 90 of the seventh embodiment, the second circuit patterns 97 of the second connecting portion 96 are disposed between the pair of branch patterns 98 provided in each of the first circuit patterns 93 of the first connecting portion 92. Thus, the regulating portion 100 for restraining both the elongation and the shrinkage of the first connecting portion (flexible base material) 92 is obtained.

Even when the flexible base material 21 of the first connecting portion 92 is softened and elongated along the direction of a surface thereof by being press-contacted, the regulating portion 100 can prevent the movement of the outer end surface 98A of each of the branch patterns 98 with the inner end surface 97A of an associated one of the second circuit patterns 97 and can restrain the elongation of the first connecting portion (flexible base material) 92.

Further, even when the flexible base material 21 of the connecting portion 92 is elongated along a surface thereof, the movement of the inner end surface 98B of the branch patterns 98 can be prevented by the outer end surface 97B of the second circuit patterns 97. Thus, the shrinkage of the first connecting portion (flexible base material) 92 can be restrained.

Consequently, each of the first circuit patterns 93 of the first connecting portion 92 is positioned at and adjusted to a connecting position facing an associated one of the second circuit patterns 97 of the second connecting portion 96. Thus, each of the first circuit patterns 93 of the first connecting portion 92 can surely be connected to an associated one of the second circuit patterns 97 of the second connecting portion 96.

In addition, the second circuit patterns 97 of the second connecting portion 96 is disposed between the pair of branch patterns 98 provided in each of the first circuit patterns 93 of the first connecting portion 92, the outer end surface 98A of each of the branch patterns 98 is in contact with the inner end surface 97A of the associated one of the second circuit patterns 97, and the inner end surface 98B of the branch patterns 98 is in contact with the outer end surface 97B of the second circuit patterns 97.

Thus, the contact area (i.e., the conduction area) between the first circuit patterns 93 of the first connecting portion 92 and the second circuit patterns 97 of the connecting portion 96 can be increased. Consequently, electrical characteristics can be improved.

Furthermore, according to the circuit board connecting structure 90 of the seventh embodiment, each of the branch patterns 98 of the first connecting portion 92 is cross-sectionally substantially trapezoidal-shaped. In addition, each of the second circuit patterns 97 of the second connecting portion 96 is cross-sectionally substantially trapezoidal-shaped. Further, the outer end surface 98A outwardly directed in a parallel arrangement direction in which the branch patterns 98 of the first connecting portion 92 are arranged in parallel with each other, and the inner end surface 97A inwardly directed in a parallel arrangement direction in which the second circuit patterns 97 are arranged in parallel with each other, are brought into surface-to-surface contact with each other. That is, the outer end surface 98A outwardly directed in the parallel arrangement direction and the inner end surface 97A inwardly directed in the parallel arrangement direction of an associated one of the second circuit patterns 97 are put into surface-to-surface contact with each other among each of the branch patterns 98. The inner end surface 98B outwardly directed in the parallel arrangement direction and the outer end surface 97B outwardly directed in the parallel arrangement direction of the associated one of the second circuit patterns 97 are put into surface-to-surface contact with each other.

Thus, the end surfaces 97A and 97B of a wedge-shaped part are put into surface-to-surface contact with those 98A and 98B of another wedge-shaped part, respectively. Consequently, the second circuit patterns 97 of the second connecting portion 96 can surely be contacted with the branch patterns 98.

Eighth Embodiment

Figure 13:
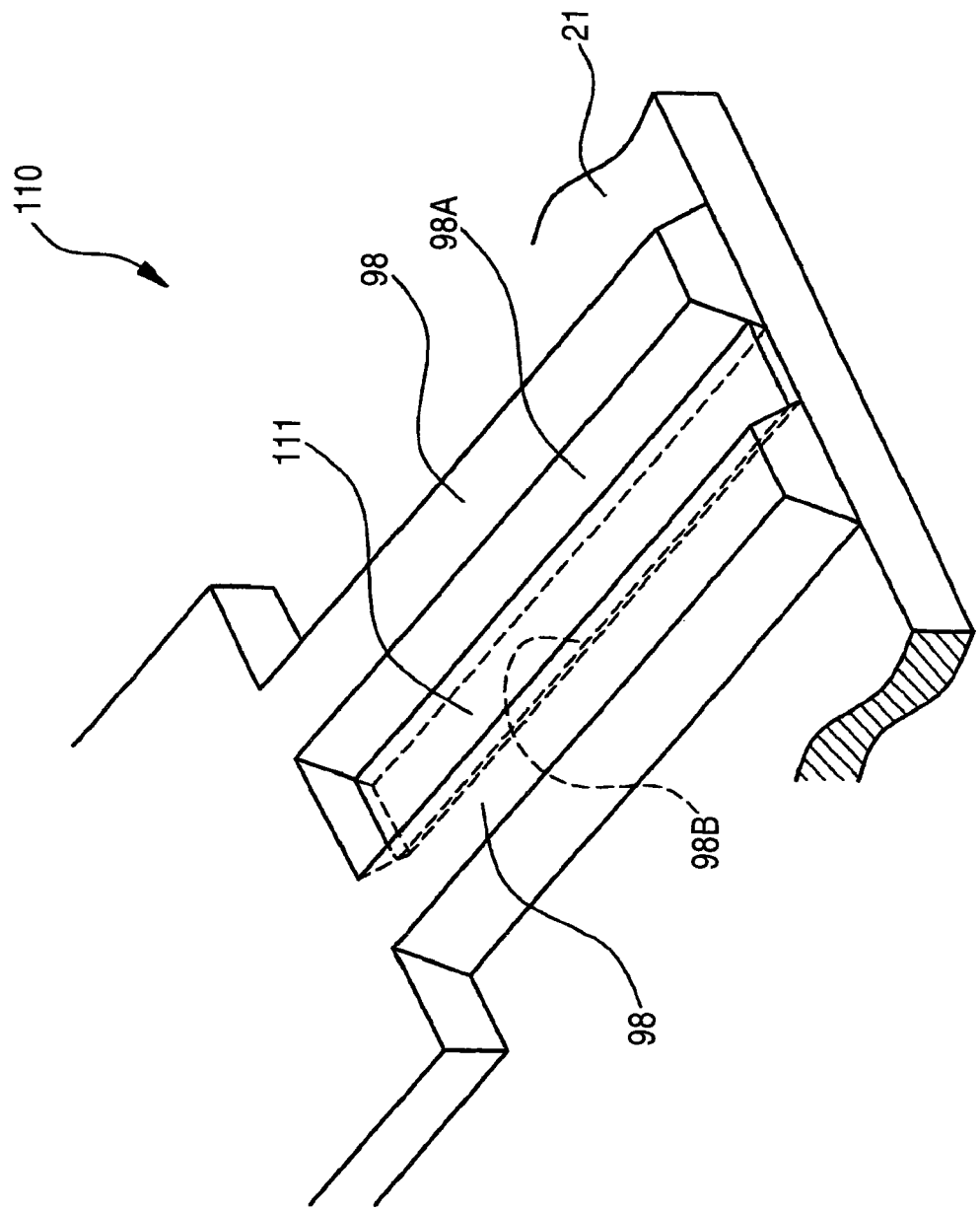
FIG. 13 is a perspective view illustrating a circuit board connecting structure (eighth embodiment) according to the invention, which is in a state before this circuit board connecting structure connects circuit boards to each other.
Figure 14:
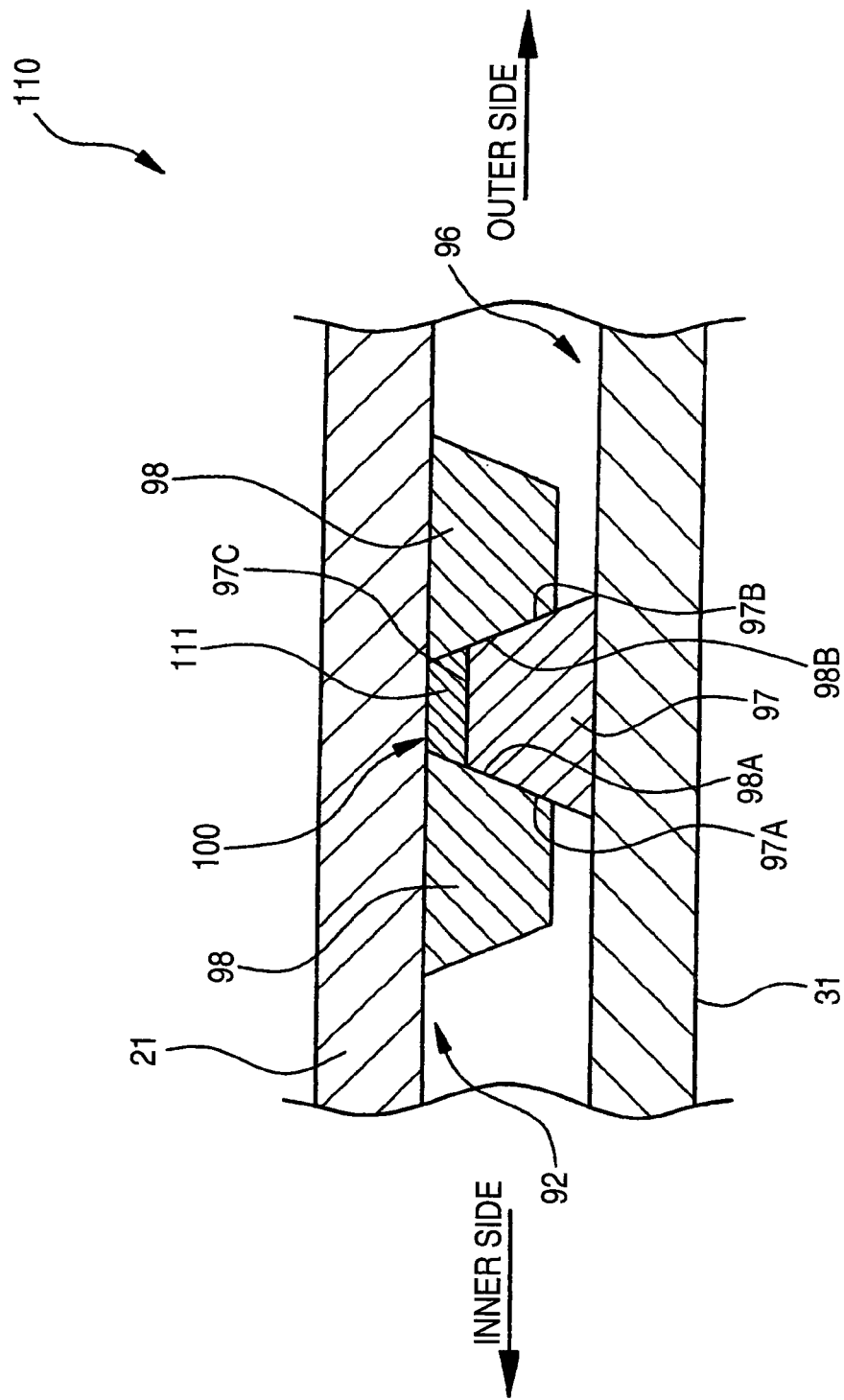
FIG. 14 is a cross-sectional view illustrating a primary part of the circuit board connecting structure according to the eighth embodiment, which is in a state after this circuit board connecting structure connects circuit boards to each other.

As illustrated in FIGS. 13 and 14, a connection structure 110 of a circuit board according to an eighth embodiment is such that the branch patterns 98 are connected to each other with plating 111 so as not to expose a flexible base material 21 from between the branch patterns 98. The remaining components of the connecting structure according to the eighth embodiment are similar to those of the connecting structure 90 according to the seventh embodiment.

The plating 111 is brought into contact with the top surface 97C of each of the second circuit patterns 97 of the second connecting portion 96 by connecting the associated branch patterns 98 to each other with the plating 111.

Accordingly, three surfaces, i.e., both side end surfaces 97A and 97B and the top surface 97C of each of the second circuit patterns 97 of the second connecting portion 96 are put into contact with the associated first circuit pattern 93 of the first connecting portion 92. Thus, the conduction area therebetween can be further increased. Consequently, the electric characteristics can be further improved.

Moreover, according to the circuit board connecting structure 110 of the eighth embodiment, advantages similar to those of the circuit board connecting structure 90 according to the seventh embodiment can be obtained.

MODIFICATIONS

In the description of the circuit board connecting structure 110 of the eighth embodiment, an example of connecting the pair of branch patterns 98 with the plating 111 has been described. However, the plating 111 is a relatively thin film.

Figure 15:
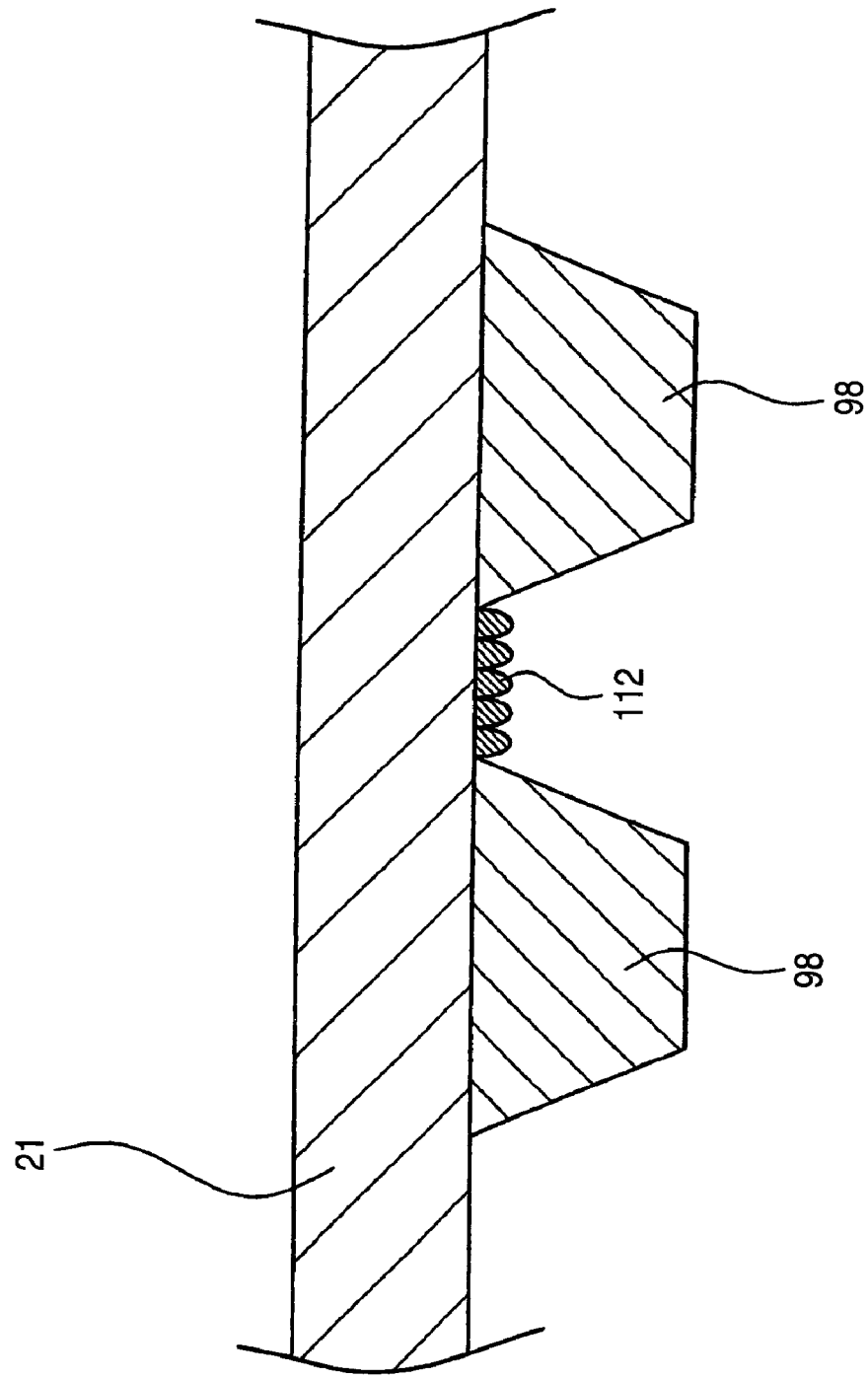
FIG. 15 is a cross-sectional view illustrating a modification of the eighth embodiment that is in a state before a circuit board connecting structure according to this modification connects circuit boards to each other.

Thus, due to surface tension, the plating 111 according to the eighth embodiment is difficult to become flat. It is considered that the plating 111 is formed into a plurality of spherical plating elements, as illustrated in FIG. 15. Even in a case where the plating 111 according to the eighth embodiment is formed into a plurality of spherical plating elements 112, as illustrated in FIG. 15, the plating element 112 can be put into contact with the top surface 97C of the second circuit pattern 97 of the second connecting portion 96.

Accordingly, even in the case of a modification illustrated in FIG. 15, the three surfaces, i.e., both the side end surfaces 97A and 97B and the top surface 97C of each of the second circuit patterns 97 of the second connecting portion 96 are brought into contact with the associated first circuit pattern 93 of the first connecting portion 92.

Consequently, even in the case of the plating elements 112 according to the modification, the conduction area therebetween can be further increased. Thus, the electric characteristics can be further improved.

Ninth Embodiment

Figure 16:
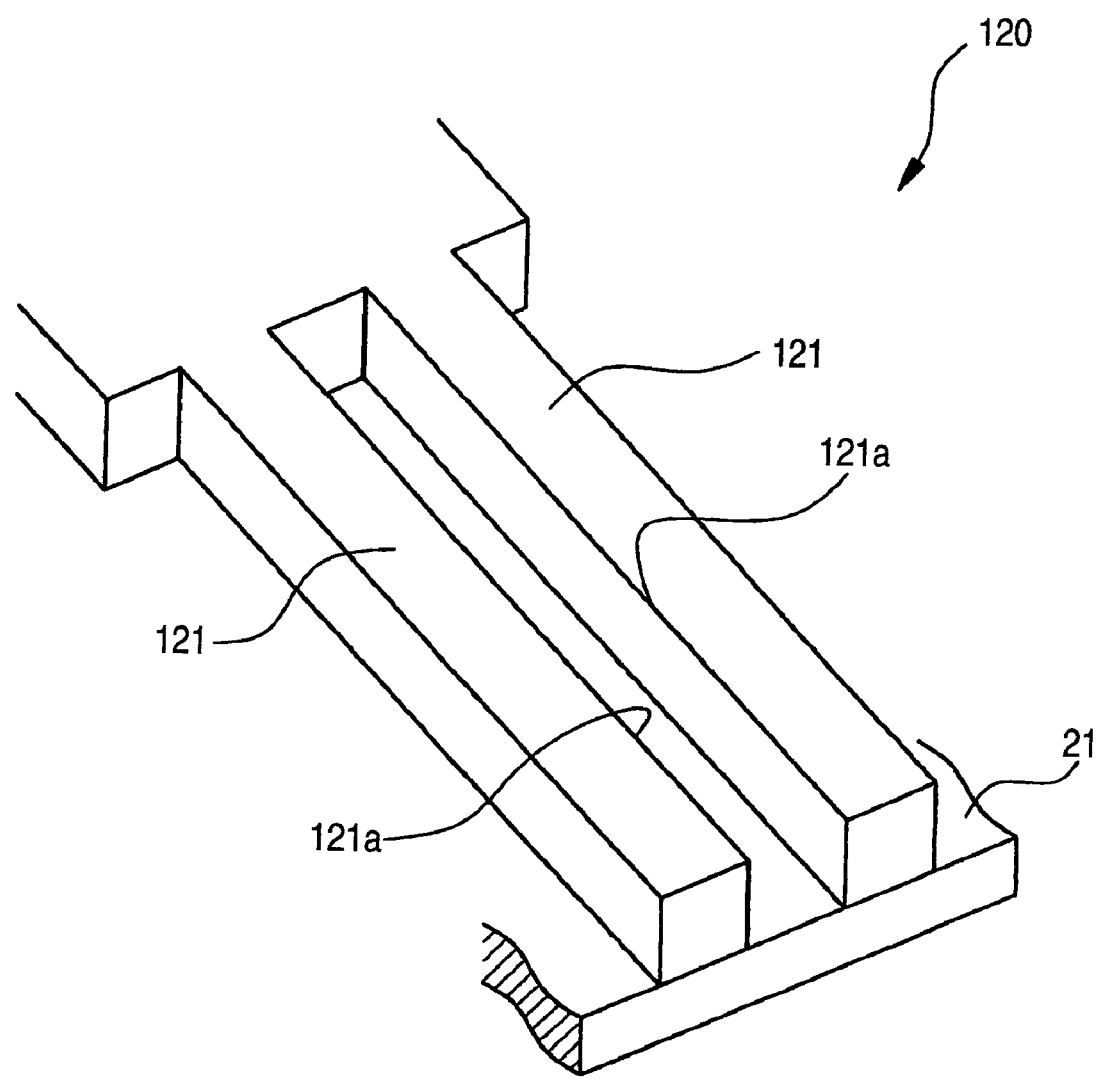
FIG. 16 is a perspective view illustrating a circuit board connecting structure (ninth embodiment) according to the invention, which is in a state before this circuit board connecting structure connects circuit boards to each other.

As illustrated in FIGS. 16 and 17, a connection structure 120 of a circuit board according to a ninth embodiment is such that each of branch patterns 121 is cross-sectionally substantially rectangular-shaped, and that each of the second circuit patterns 97 of the second connecting portion 96 is cross-sectionally substantially trapezoidal-shaped. The remaining components of the connecting structure according to the ninth embodiment are similar to those of the connecting structure 90 according to the seventh embodiment.

Figure 17A:
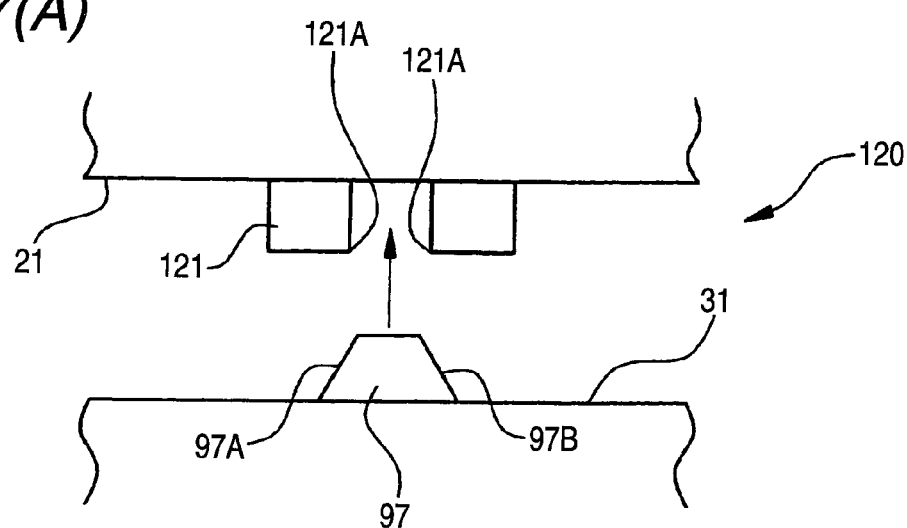
FIG. 17 is a view illustrating a connecting process performed by the circuit board connecting structure according to the ninth embodiment.

As illustrated in FIG. 17(A), the second circuit patterns 97 of the second connecting portion 96 are moved in the direction of an arrow towards a space between the associated branch patterns 121 of the connecting portion 96.

Figure 17B:
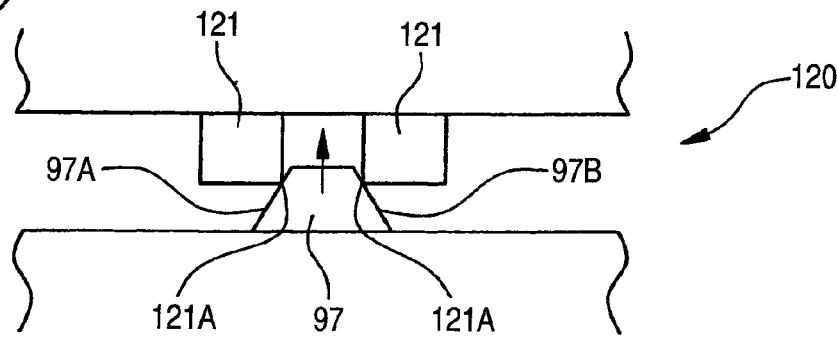

As illustrated in FIG. 17(B), the inner end surface 97A and the outer end surface 97B of the second circuit pattern 97 abut against corner portions 121A of the branch patterns 121, respectively.

The second circuit patterns 97 of the second connecting portion 96 continue to move in the direction of the arrow towards the space between the associated branch patterns 121 of the connecting portion 96.

Incidentally, the branch patterns 121 are formed of, e.g., a Cu/Au alloy. On the other hand, each of the second circuit patterns 97 is formed of a Cu/Ni/Au alloy, similarly to an ordinary circuit pattern.

Thus, the branch patterns 121 can be formed so as to be relatively easily deformable, as compared with the second circuit patterns 97.

Thus, the corner portions 121A of each of the branch patterns 121 are deformed by causing the second circuit pattern 97 to continuingly move after the corner portions 121A of each of the branch patterns 121 abut against the inner end surface 97A and the outer end surface 97B of the associated second circuit pattern 97.

Contact surfaces 121B are formed by the deformation of the corner portions 121A.

Figure 17C:
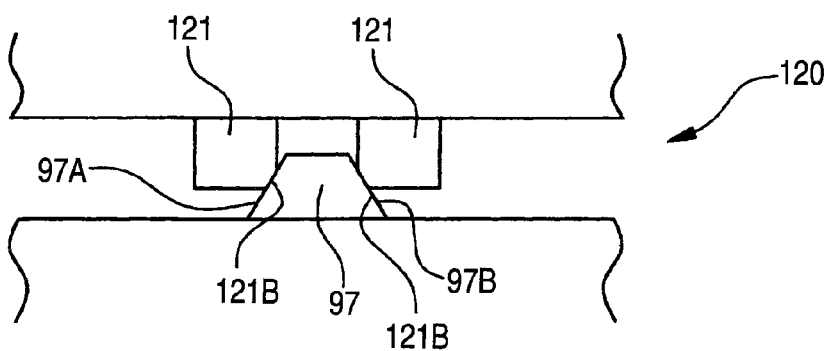

Consequently, as illustrated in FIG. 17(C), the contact surfaces 121B of the circuit patterns 121 are brought into surface-to-surface contact with the inner end surface 97A and the outer end surface 97B of the associated second circuit pattern 97.

That is, according to the circuit board connecting structure 120 of the ninth embodiment, the end surface 121B of each of the branch patterns 121 is put into surface-to-surface contact with an associated one of the end surfaces 97A and 97B of the associated second circuit pattern 97 of the second connecting portion 96 by press-fitting the associated second circuit pattern 97 into between the branch patterns 121.

Thus, each of the branch patterns 121 is put into surface-to-surface contact with the associated circuit pattern 121. Consequently, the second circuit patterns 97 of the second connecting portion 96 can surely be contacted with the branch patterns 121.

Moreover, according to the circuit board connecting structure 120 of the ninth embodiment, advantages similar to those of the circuit board connecting structure 90 according to the seventh embodiment can be obtained.

Incidentally, in the ninth embodiment, there has been described an example of cross-sectionally shaping each of the branch patterns 121 substantially like a rectangle and also cross-sectionally shaping each of the second circuit patterns 97 of the second connecting portion 96 substantially like a trapezoid. The shapes of the branch patterns and the second circuit patterns according to the invention are not limited thereto. Similar advantages can be obtained by cross-sectionally shaping each of the branch patterns 121 substantially like a trapezoid and also cross-sectionally shaping each of the second circuit patterns 97 of the second connecting portion 96 substantially like a rectangle.

Tenth Embodiment

Figures 18A, 18B:
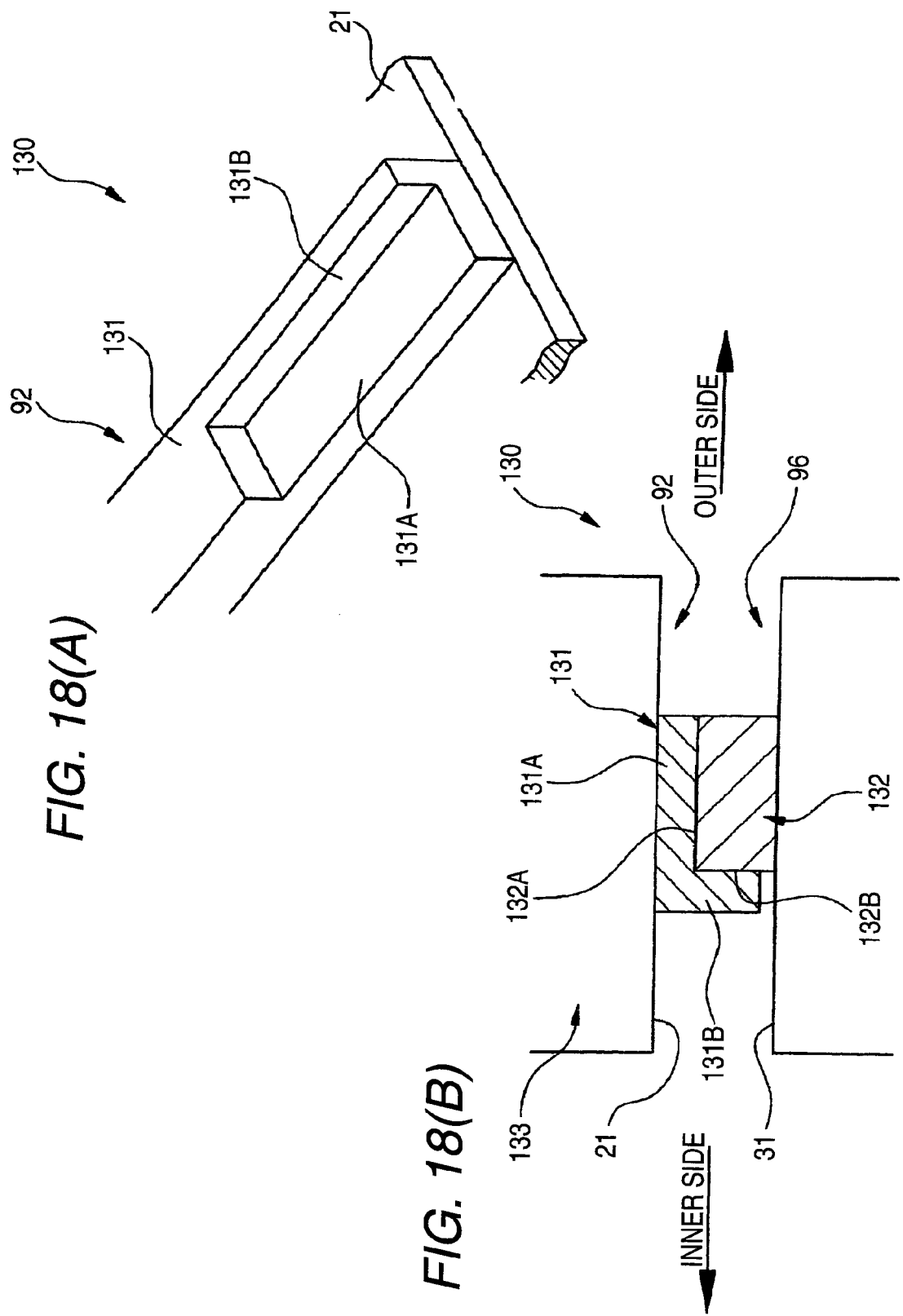
FIG. 18 includes a perspective view and a cross-sectional view illustrating a circuit board connecting structure (tenth embodiment) according to the invention, which is in a state before this circuit board connecting structure connects circuit boards to each other.

As illustrated in FIGS. 18(A) and 18(B), a circuit board connecting structure 130 according to a tenth embodiment is such that first circuit patterns (circuit patterns) 131 of a first connecting portion 92 is formed so as to be cross-sectionally substantially L-shaped, and that second circuit patterns (circuit patterns) 132 of a second connecting portion 96 is formed so as to be cross-sectionally substantially rectangular-shaped. The remaining components of the connecting structure according to the second embodiment are similar to those of the connecting structure 90 according to the seventh embodiment.

As illustrated in FIG. 18(B), each of the first circuit patterns 131 of the first connecting portion 92 is formed so that a horizontal portion 131A and an erected wall portion (outer end surface) 131B are cross-sectionally substantially L-shaped. The horizontal portion 131A of the first circuit pattern 131 is brought into surface-to-surface contact with the top surface 132A of an associated one of the second circuit patterns 132. The erected wall portion 131B of each of the first circuit patterns 131 is put into surface-to-surface contact with an inner end surface 132B of an associated one of the second circuit patterns 132.

Consequently, as compared with a case where surfaces of the first circuit patterns 131 and the second circuit patterns 132 are contacted with each other, the contact area between the first circuit patterns 131 and the second circuit patterns 132 can be increased, i.e., the conduction area therebetween can be increased.

In addition, the erected wall portion 131B of each of the first circuit patterns 131 is put into surface-to-surface contact with the inner end surface 132B of an associated one of the second circuit patterns 132.

That is, the circuit board connecting structure 130 is provided with a regulating portion 133 on which the erected wall portion 131B directed outwardly in the parallel arrangement direction of each of the first circuit patterns 131 of the first connecting portion 92 is contacted with the inner end surface 132B directed inwardly in the parallel arrangement direction of each of second circuit patterns 132 of the second connecting portion 96.

Thus, even when the flexible base material 21 of the first connecting portion 92 is softened and elongated along the direction of a surface thereof by being press-contacted, the movement of the erected wall portion 131B of each of the first circuit patterns 131 is prevented by the inner end surface 132B of an associated one of the second circuit pattern 132. Accordingly, the elongation of the first connecting portion (flexible base material) 92 can be restrained.

Consequently, the conduction area can be increased while the elongation of the first connecting portion (flexible base material) 92 is prevented.

Further, according to the circuit board connecting structure 130 of the tenth embodiment, advantages similar to those of the connecting structure 90 according to the seventh embodiment can be obtained.

Incidentally, in the tenth embodiment, there has been described an example of forming each of the first circuit patterns 131 of the first connecting portion 92 so as to have a cross-sectional substantially L-shape. The cross-sectional shape of each of the first circuit patterns 131 of the first connecting portion 92 is not limited thereto. Similar advantages can be obtained even in a case where each of the second circuit patterns 132 of the second connecting portion 96 is cross-sectionally substantially L-shaped.

Figure 19A:
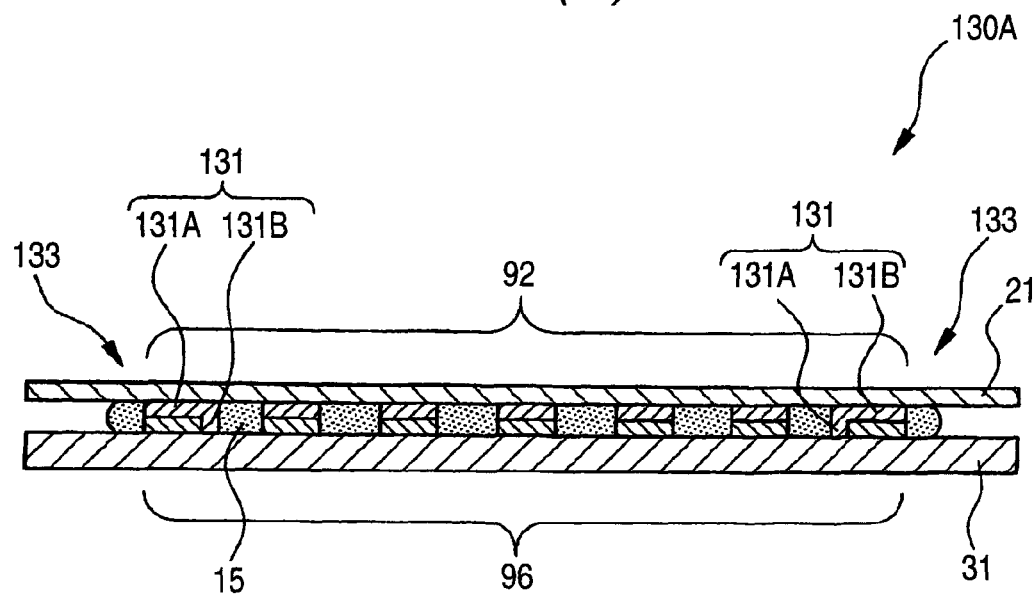
FIG. 19 is a cross-sectional view illustrating a primary part of the circuit board connecting structure according to the tenth embodiment, which is in a state after this circuit board connecting structure connects circuit boards to each other.

In a case where each of the first circuit patterns 131 of the first connecting portion 92 is formed so as to have a cross-sectional substantially L-shape, as illustrated in FIG. 19(A), the first circuit patterns 131 can be disposed at both end portions in the arrangement direction thereof so that the end surfaces (outer end surfaces) of the erected wall portions 131B of the first circuit patterns 131 respectively disposed thereat are directed in a direction in which the end surfaces thereof are moved away from each other.

Therefore, even when the flexible base material 21 of the first connecting portion 92 is softened and elongated in the direction of a surface thereof by being press-contacted, the movement of the erected wall 131B of each of the first circuit patterns 131 is prevented by the associated second circuit patterns 132. Thus, the elongation of the first connecting portion (flexible base material) 92 can be restrained.

Figure 19B:
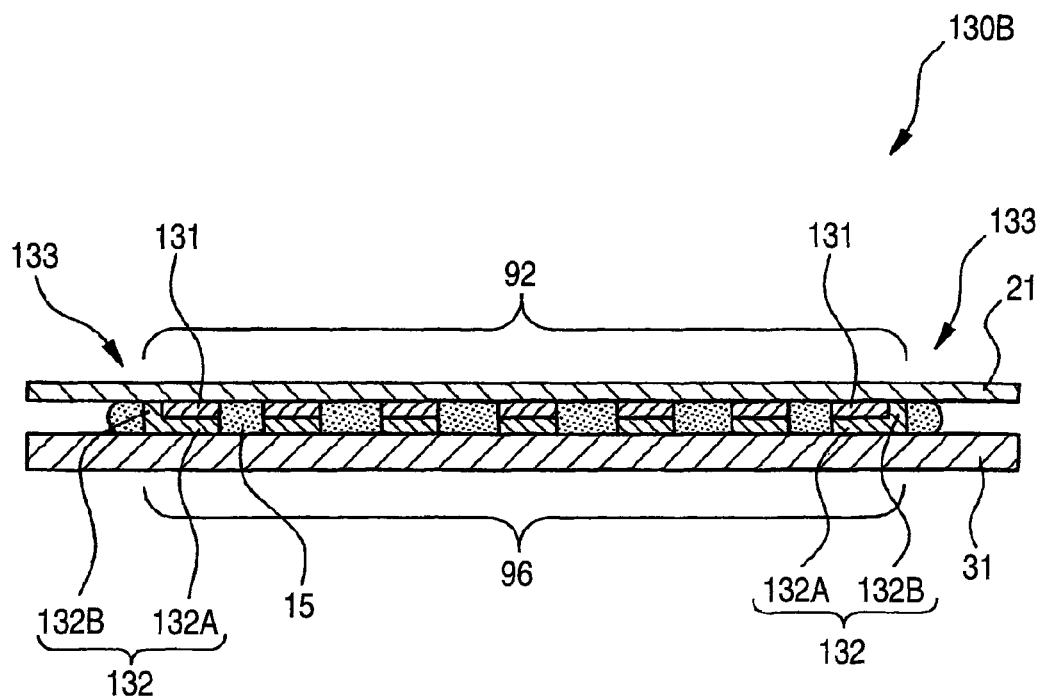

On the other hand, in a case where each of the second circuit patterns 132 of the second connecting portion 96 is formed so as to have a cross-sectionally substantial L-shape, as illustrated in FIG. 19(B), the second circuit patterns 132 are disposed at both end portions in the arrangement direction thereof so that the end surfaces (inner end surfaces) of the erected wall portions 132B of the second circuit patterns 132 respectively disposed at both end portions face each other.

Consequently, even when the flexible base material 21 of the first connecting portion 92 is softened and elongated along the direction of a surface thereof by being press-contacted, the movement of each of the first circuit patterns 131 is prevented by the erected wall portion 132B of an associated one of the second circuit patterns 132. Accordingly, the elongation of the first connecting portion (flexible base material) 92 can be restrained.

Eleventh Embodiment

Figure 20:
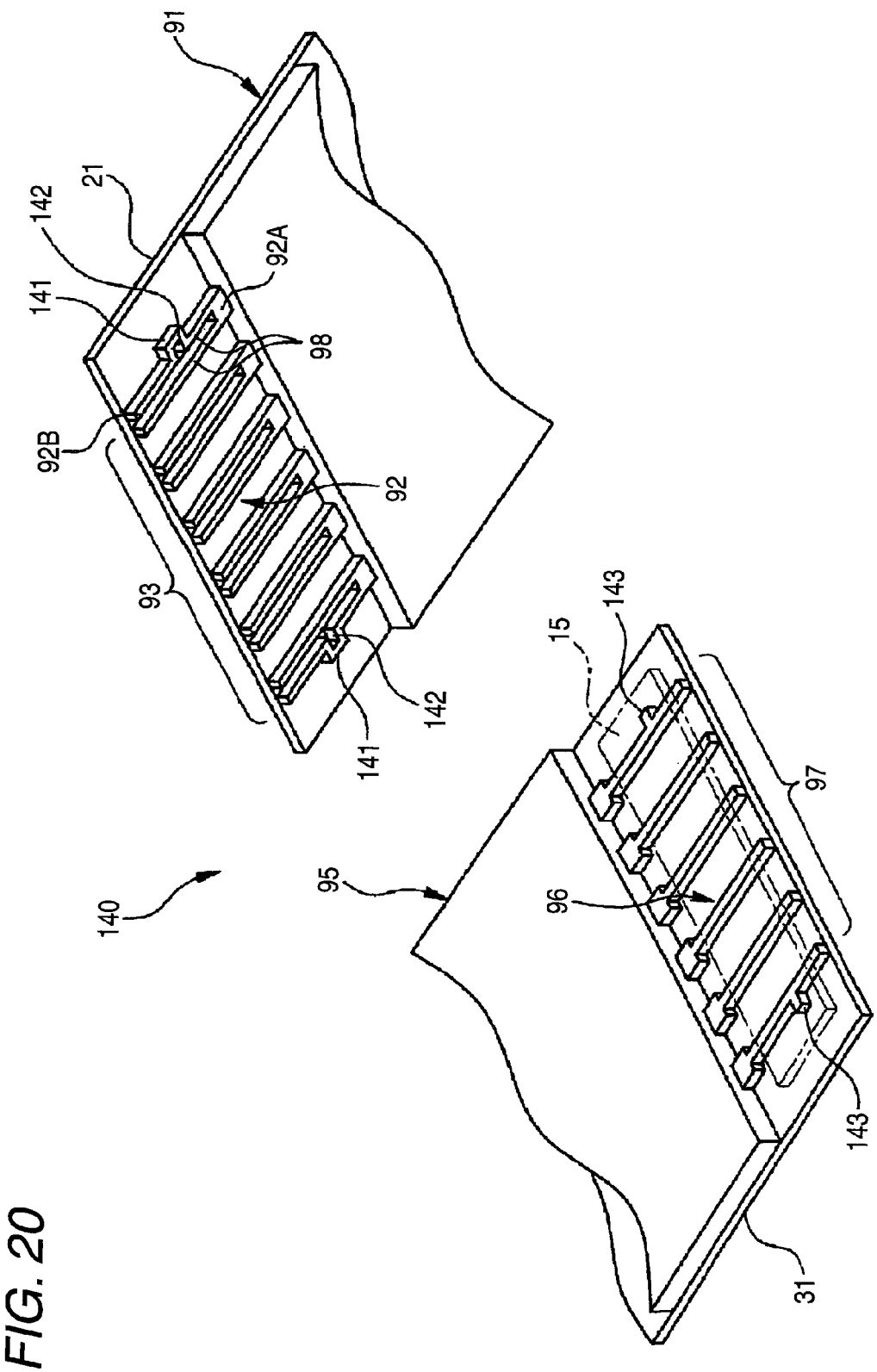
FIG. 20 includes a perspective view and a cross-sectional view illustrating a circuit board connecting structure (eleventh embodiment) according to the invention, which is in a state before this circuit board connecting structure connects circuit boards to each other.
Figure 22A:
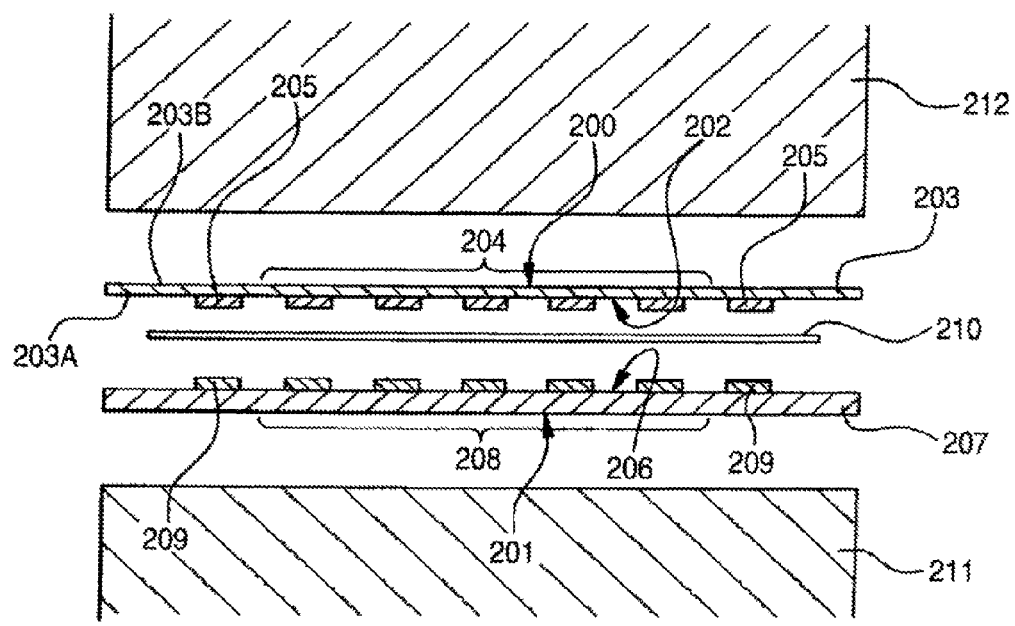
FIG. 22 is a view illustrating a process of press-contacting the conventional circuit board connecting structure.
Figure 22B:
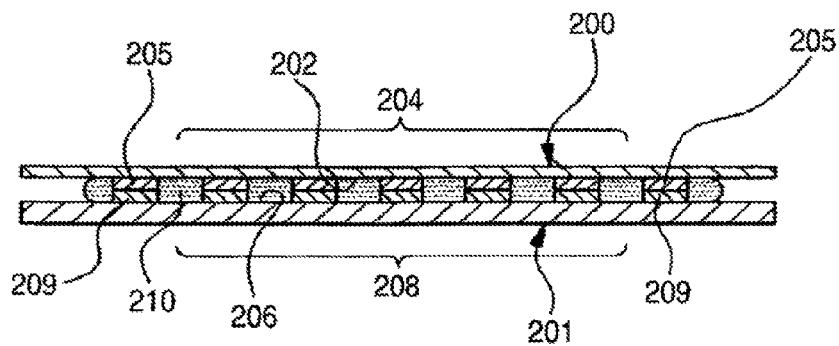
Figure 23:
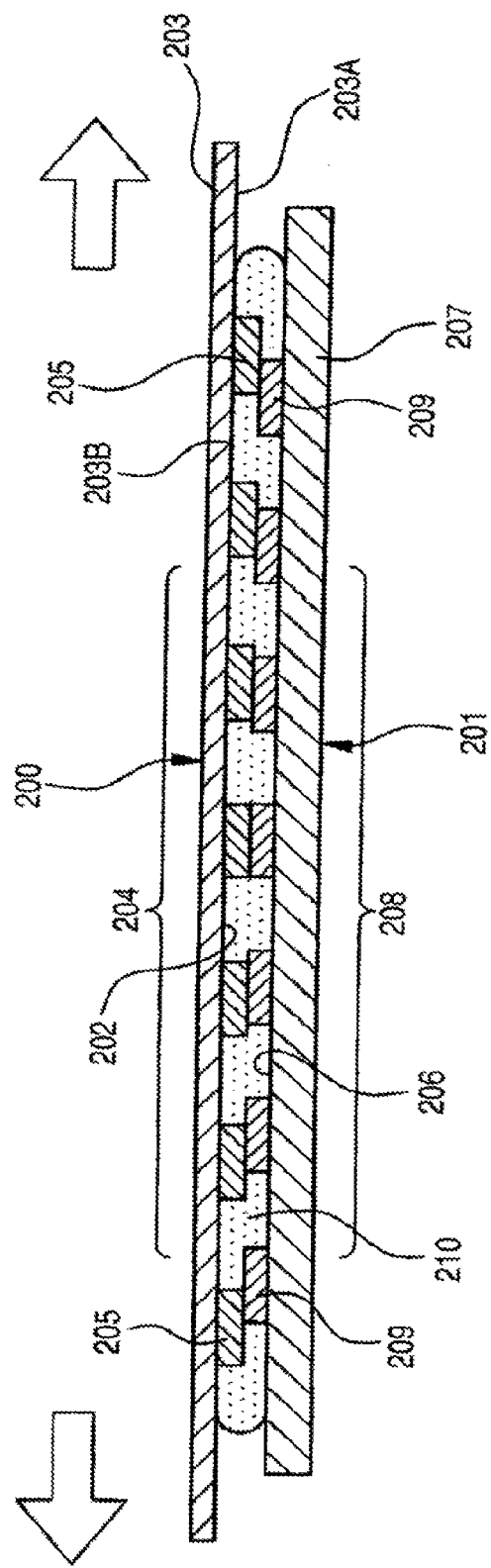
FIG. 23 is a view illustrating a state in which the conventional circuit board connecting structure is press-contacted.

As illustrated in FIG. 20, a circuit board connecting structure 140 according to a tenth embodiment is such that an outwardly projecting part 141 is provided on an outermost one of branch patterns 98 respectively provided in the first circuit patterns 93 of the first connecting portion 92, that an accommodating portion 142 is formed in the projecting part 141, and that the accommodating portion 142 is communicated with a space formed between the paired branch patterns 98.

Further, the connection structure 140 of the circuit board is such that an outwardly projecting part 143 is provided on an outermost one of the second circuit patterns 97 of the second connecting portion 96. The projecting part 143 is formed to be able to be fit into the accommodating portion 142.

Incidentally, the remaining components of the connecting structure according to the eleventh embodiment are similar to those of the connecting structure 90 according to the seventh embodiment.

The circuit board connecting structure 140 is such that the second circuit pattern 97 of the second connecting portion 96 is disposed between each pair of the branch patterns 98, and that the projecting part 143 of the second circuit pattern 97 is fit into the accommodating portion 142 formed between the branch patterns 98.

Consequently, the first connecting portion (flexible base material) 92 can be prevented from being elongated and shrunk in a direction perpendicular to the longitudinal direction of each of the second circuit patterns 97. In addition, the first connecting portion (flexible base material) 92 can be restrained from being elongated and shrunk in the longitudinal direction of each of the second circuit patterns 97.

Further, according to the circuit board connecting structure 140 of the eleventh embodiment, the same effect as the circuit board connecting structure 90 of the seventh embodiment is obtained.

INDUSTRIAL APPLICABILITY

The invention is preferable to be applied to a circuit board connecting structure, which connects a circuit board made of a flexible base material to that made of a rigid base material.

The invention claimed is:

1. A circuit board connecting structure comprising:
a first circuit board having first circuit patterns on a surface of a first base material, the first circuit patterns arranged in parallel to one another, and the first base material being flexible and expanding when heated; and
a second circuit board having second circuit patterns on a surface of a second base material, the second circuit patterns arranged in parallel to one another, and the second base material being rigid, wherein
the second circuit patterns includes a conductor pattern having a bottom surface adjacent the second base material and a top surface distal from the second base material, the top surface of the conductor pattern being narrower than the bottom surface,
the first circuit patterns includes a branch pattern including two electrically connected circuit patterns and a groove defined between the two electrically connected circuit patterns, the groove having a portion wider than the top surface of the conductor pattern and narrower than the bottom surface of the conductor pattern, the groove including a bottom that is plated, the two electrically connected circuit patterns of the branch pattern being electrically connected with each other through the plated bottom and
the conductor pattern is, when the first circuit board and the second circuit board are connected to each other, (i) disposed in the groove, whereby movement of the first circuit patterns relative to the second circuit patterns is restricted and (ii) electrically connected to the branch pattern.

2. The circuit board connecting structure according to claim 1, wherein
the top surface of the conductor pattern contacts with the plated bottom of the branch pattern when the first circuit board and the second circuit board are connected to each other, whereby the conductor pattern and the branch pattern are electrically connected with each other.

3. The circuit board connecting structure according to claim 1, wherein
the branch pattern is deformable and is deformed by the conductor pattern when the conductor pattern is pressed into the groove, and
the conductor pattern is electrically connected with the branch pattern through an end surface of the conductor pattern and a contact surface of the branch pattern formed by the deforming.

4. The circuit board connecting structure according to claim 1, wherein
the conductor pattern includes an outer end surface,
one of the two electrically connected circuit patterns of the branch pattern (i) is disposed outwardly from the conductor pattern and (ii) has an inner end surface, and
when the first circuit board and the second circuit board are connected to each other, the outer end surface contacts with the inner end surface whereby conductor pattern and the branch pattern are electrically connected with each other.

5. The circuit board connecting structure according to claim 3, wherein
each of the two electrically connected circuit patterns of the branch pattern has a rectangular cross-section in a plane perpendicular to a surface of the second base material, and
the end surface of the conductor pattern deforms a corner of the rectangular cross-section when the conductor pattern is pressed into the groove, whereby the contact surface is formed.

* * * * *